(12) United States Patent
Kinoshita et al.

(10) Patent No.: US 7,589,381 B2
(45) Date of Patent: Sep. 15, 2009

(54) FIELD EFFECT TRANSISTOR AND MANUFACTURING METHOD THEREOF

(75) Inventors: Atsuhiro Kinoshita, Kamakura (JP); Junji Koga, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/519,794

(22) Filed: Sep. 13, 2006

(65) Prior Publication Data

US 2007/0007590 A1 Jan. 11, 2007

Related U.S. Application Data

(62) Division of application No. 10/933,333, filed on Sep. 3, 2004, now Pat. No. 7,119,402.

(30) Foreign Application Priority Data

| Sep. 5, 2003 | (JP) | ............................. 2003-314328 |
| Aug. 31, 2004 | (JP) | ............................. 2004-251534 |

(51) Int. Cl.
   *H01L 47/00* (2006.01)
(52) U.S. Cl. .................................... 257/347
(58) Field of Classification Search ................. 257/347, 257/348–349, 368, 402, 403, 404, 405, 406, 257/407, E27.112, E21.048, E21.063, E21.409
   See application file for complete search history.

(56) References Cited

U.S. PATENT DOCUMENTS

| 4,847,212 A | * | 7/1989 | Balzan et al. ................ 438/174 |
| 4,849,376 A | * | 7/1989 | Balzan et al. ................ 438/582 |
| 4,965,218 A | * | 10/1990 | Geissberger et al. ......... 438/182 |
| 5,049,953 A | | 9/1991 | Mihara et al. |
| 5,170,231 A | | 12/1992 | Fujii et al. |
| 5,675,533 A | | 10/1997 | Niuya et al. |
| 5,801,416 A | * | 9/1998 | Choi et al. ................... 257/335 |
| 5,888,859 A | * | 3/1999 | Oku et al. .................... 438/174 |
| 5,936,265 A | | 8/1999 | Koga |

(Continued)

FOREIGN PATENT DOCUMENTS

| CN | 1369903 A | 9/2002 |
| JP | 59-47767 | 3/1984 |
| JP | 09-260690 | 10/1999 |
| WO | WO 01/71818 A1 | 9/2001 |

OTHER PUBLICATIONS

Tucker, J. R. et al., "Silicon Field-Effect Transistor Based on Quantum Tunneling", Appl. Phys. Lett., vol. 65, No. 5, pp. 618-620, (Aug. 1, 1994).

(Continued)

*Primary Examiner*—Nathan W Ha
(74) *Attorney, Agent, or Firm*—Finnegan, Henderson, Farabow, Garrett & Dunner, L.L.P.

(57) ABSTRACT

A field effect transistor includes a first semiconductor region forming a channel region, a gate electrode insulatively disposed above the first semiconductor region, source and drain electrodes formed to sandwich the first semiconductor region in a channel lengthwise direction, and second semiconductor regions formed between the first semiconductor region and the source and drain electrodes and having impurity concentration higher than the first semiconductor region. The thickness of the second semiconductor region in the channel lengthwise direction is set to a value equal to or less than depletion layer width determined by the impurity concentration so that the second semiconductor region is depleted in a no-voltage application state.

13 Claims, 15 Drawing Sheets

U.S. PATENT DOCUMENTS

| | | | |
|---|---|---|---|
| 6,413,829 B1 | 7/2002 | Yu | |
| 6,528,848 B1 * | 3/2003 | Hoshino et al. | 257/339 |
| 6,683,362 B1 | 1/2004 | O et al. | |
| 6,833,556 B2 * | 12/2004 | Grupp et al. | 257/24 |
| 2001/0012671 A1 * | 8/2001 | Hoshino et al. | 438/305 |
| 2001/0028067 A1 | 10/2001 | Awano | |
| 2002/0167088 A1 * | 11/2002 | Hoshino et al. | 257/758 |
| 2004/0026736 A1 * | 2/2004 | Grupp et al. | 257/330 |
| 2004/0041226 A1 * | 3/2004 | Snyder et al. | 257/471 |

OTHER PUBLICATIONS

Notification of the First Office Action mailed Mar. 2, 2007, in Chinese Application No. 2004100686328, and English language translation thereof.

Notification of the First Office Action issued from the Chinese Patent Office in Counterpart Application No. 2007101273345, dated Nov. 7, 2008.

Notice of Reasons for Rejection mailed by the Japanese Patent Office on Jun. 23, 2009, for Japanese Patent Application No. 2004-251534, and English-language translation thereof.

* cited by examiner

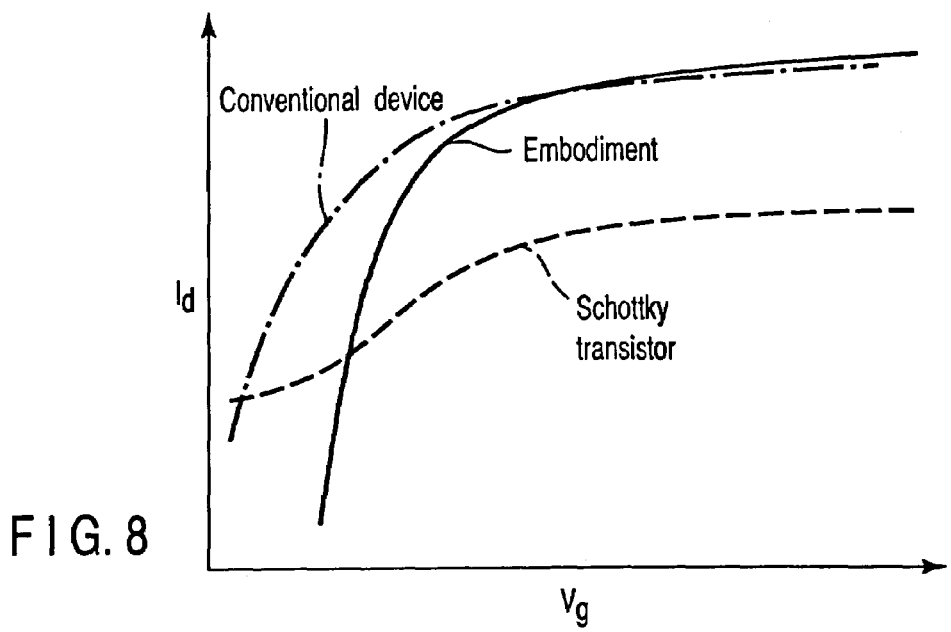
F I G. 8
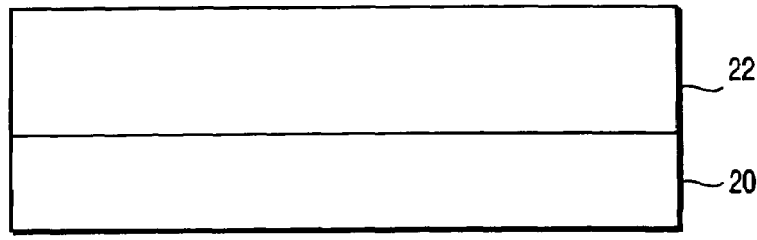
F I G. 9A
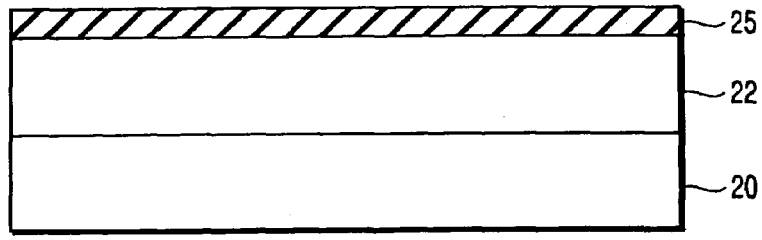
F I G. 9B
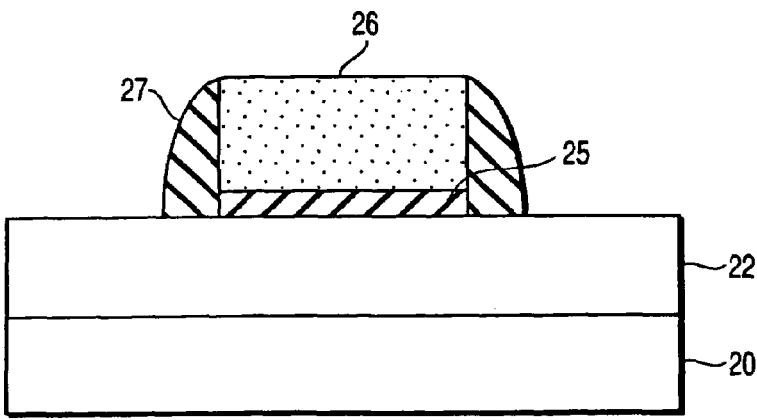
F I G. 9C

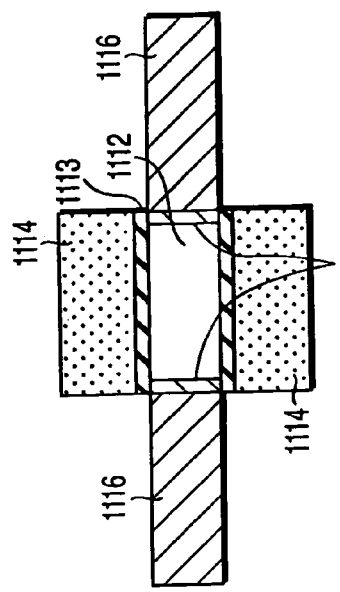
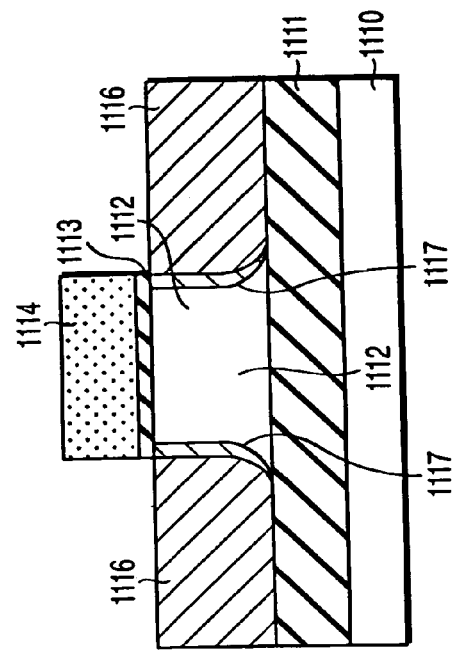
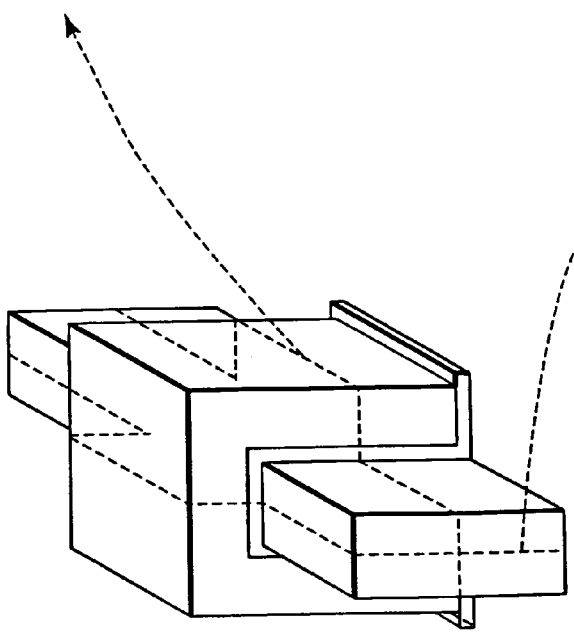

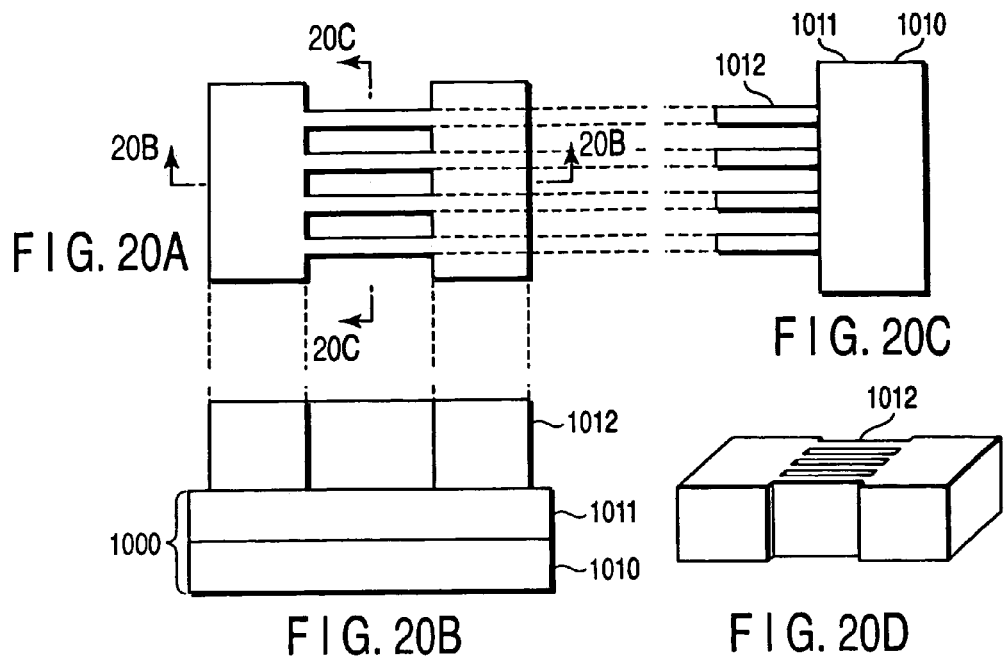
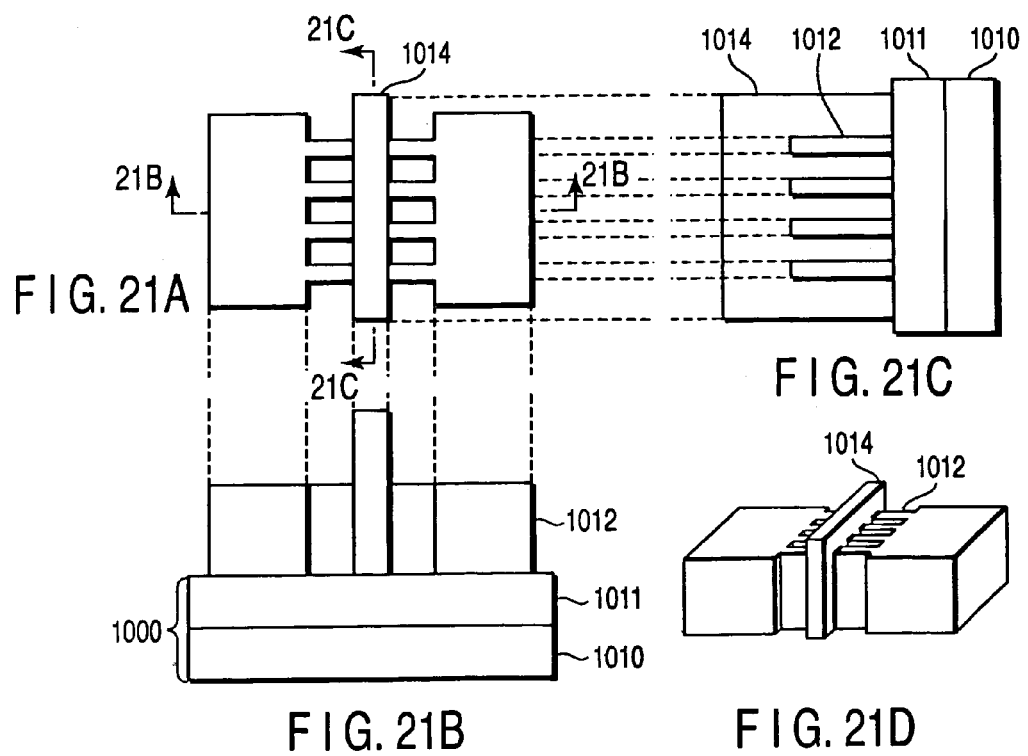

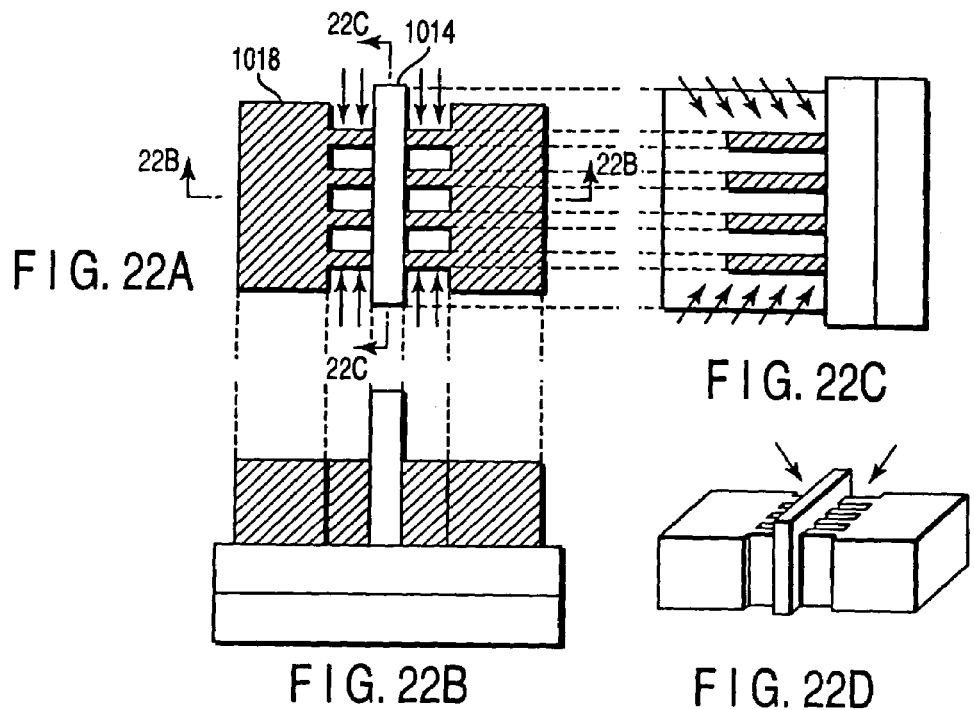
FIG. 22A  FIG. 22C
FIG. 22B  FIG. 22D
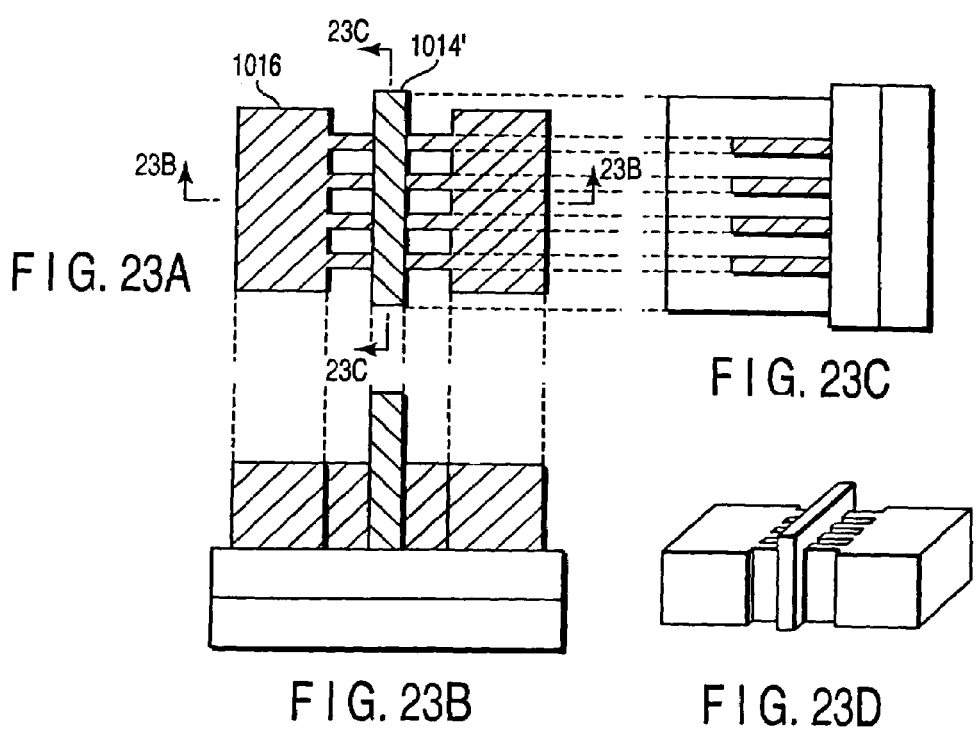
FIG. 23A  FIG. 23C
FIG. 23B  FIG. 23D

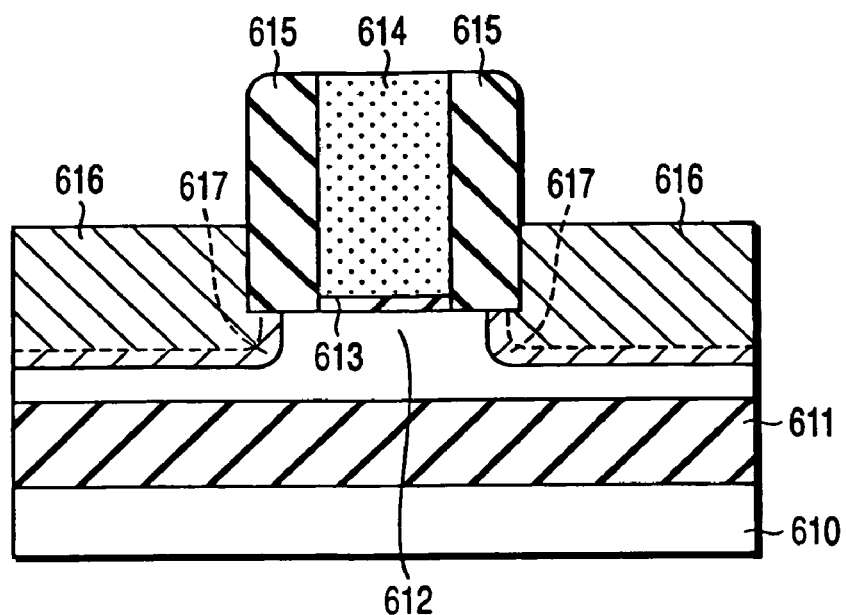
F I G. 24
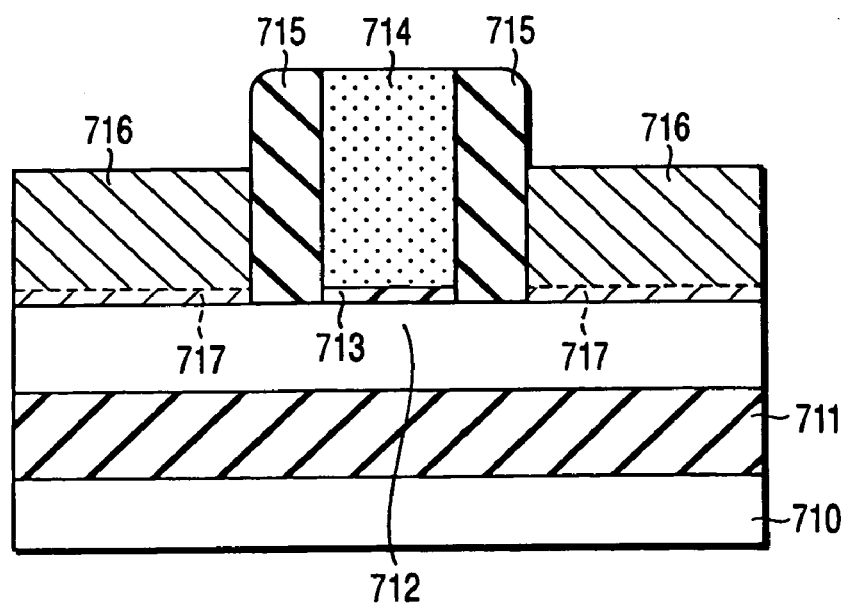
F I G. 25

FIELD EFFECT TRANSISTOR AND MANUFACTURING METHOD THEREOF

CROSS-REFERENCE TO RELATED APPLICATIONS

This application is a division of application Ser. No. 10/933,333, filed on Sep. 3, 2004, and is based upon and claims the benefit of priority from prior Japanese Patent Application No. 2003-314328, filed Sep. 5, 2003 and No. 2004-251534, filed Aug. 31, 2004, the entire contents of all of which are incorporated herein by reference.

BACKGROUND OF THE INVENTION

1. Field of the Invention

This invention relates to a semiconductor device and more particularly to a MIS field effect transistor having a source and drain improved and a manufacturing method thereof.

2. Description of the Related Art

In order to enhance the performance of a semiconductor integrated circuit, it is necessary to enhance the performance of field effect transistors which are the constituent elements thereof. The guiding principle for the improvement of the performance of the elements is based on scaling and the element performance has been enhanced by miniaturizing the elements so far. However, the limitation of miniaturization in future is pointed out and formation of shallow junction becomes a serious problem. At present, a solution for formation of 10 to 20 nm junction (drain-extension portion) of the 65-nm generation cannot be given according to the international semiconductor road map.

In recent years, a MOSFET having a source and drain formed to form Schottky junction instead of the conventional pn junction is proposed (J. R. Tucker et al., Appl. Phys. Lett., vol. 65, no. 5, August 1994, pp. 618-620). According to the document, since source and drain portions are formed of metal, diffusion of impurity is not utilized and extremely shallow junction can be formed. Further, various advantages that parasitic resistance can be lowered since the resistance of metal itself is extremely low, an ion-implantation process can be omitted to simplify the process and the like can be attained. Thus, the above MOSFET is expected as a field effect transistor of next generation.

In this type of field effect transistor with the Schottky junction, an effect that the parasitic resistance of the source and drain portions is lowered and the short channel effect is suppressed can be attained. However, since the field effect transistor utilizes the Schottky junction, there occurs a problem that a leak current becomes large.

Thus, in the conventional case, in order to lower the parasitic resistance of the source and drain portions and suppress the short channel effect, the field effect transistor having the source and drain formed to form the Schottky junction is effective. However, in this type of Schottky transistor, there occurs a problem that a leakage current becomes large.

More specifically, in this type of Schottky transistor, the Schottky junction of the source and drain portions determines the characteristic of the transistor. Therefore, in order to realize a preferable characteristic, it is necessary to sufficiently lower the height of a Schottky barrier of metal used to form the source and drain portions in comparison with that of carriers. However, the Schottky barrier height is originally and substantially determined by the type of metal and it is difficult to freely control the Schottky barrier height.

To control the Schottky barrier height as is desired, it is proposed that a source-drain impurity layer to be bonded to the Schottky source and drain. The resultant structure is nothing more than a transistor that has a pn junction used as source and drain. The structure can no longer retain the characteristics of a Schottky transistor that suppresses short-channel effect.

BRIEF SUMMARY OF THE INVENTION

A field effect transistor according to an aspect of the invention comprises a first semiconductor region forming a channel region, a gate electrode insulatively disposed above the first semiconductor region, a source electrode and a drain electrode which are formed, respectively, on both sides of the first semiconductor region in a position corresponding to the gate electrode, and second semiconductor regions each formed between the first semiconductor region and a corresponding one of the source electrode and the drain electrode, and having an impurity concentration higher than the first semiconductor region, wherein portions of the second semiconductor regions which are formed in contact with the first semiconductor region are fully depleted in a channel lengthwise direction in a no-voltage application state.

A field effect transistor manufacturing method according to another aspect of the present invention comprises disposing a gate electrode insulatively above a part of a first semiconductor region made of Si, ion-implanting impurity into the first semiconductor region with the gate electrode used as a mask, carrying out heat treatment to activate the ion-implanted impurity, and forming source and drain electrodes by siliciding a region corresponding to an ion-implanted portion of the first semiconductor region to a depth larger than a depth of the ion-implanted portion, and forming second semiconductor regions in interfaces each between the first semiconductor region and a corresponding one of the source and drain electrodes to a thickness by which the second semiconductor regions are fully depleted in a no-voltage application state, by segregation of the impurities which is due to the siliciding.

A field effect transistor of a CMOS structure having an nMOS field effect transistor and a pMOS field effect transistor according to a still another aspect of the present invention, comprises an nMOS portion which includes a first semiconductor region forming a channel region, a gate electrode insulatively disposed above the first semiconductor region, a first source electrode and a first drain electrode which are formed of first metal and sandwich the first semiconductor region in a channel lengthwise direction, and second semiconductor regions each formed between the first semiconductor region and a corresponding one of the first source electrode and the first drain electrode, and having an impurity concentration higher than that of the first semiconductor region, and a pMOS portion which includes a third semiconductor region forming a channel region, a gate electrode insulatively disposed above the third semiconductor region, and a second source electrode and a second drain electrode which are formed of second metal and sandwich the third semiconductor region in a channel lengthwise direction, wherein the first source electrode and the first drain electrode of the nMOS portion and the second source electrode and the second drain electrode of the pMOS portion are formed of the same material.

A field effect transistor according to another aspect of the present invention comprises a semiconductor region forming a channel region having an impurity concentration, a gate electrode insulatively disposed above the semiconductor region, and a source electrode and a drain electrode which are made of metal and formed on both sides of a portion of the semiconductor region which corresponds in position to the gate electrode, wherein the source electrode and the drain electrode each have an impurity concentration higher than the impurity concentration of the channel region, and a peak of the impurity concentration in an interface with respect to the channel region and a portion of the channel region which is near the interface.

BRIEF DESCRIPTION OF THE SEVERAL VIEWS OF THE DRAWING

FIG. 8 is a diagram showing the Vg-Id characteristic of the transistor of the first embodiment in comparison with that of the conventional element, FIGS. 9A to 9F are cross sectional views showing the manufacturing steps for forming a MIS field effect transistor according to a second embodiment of this invention, FIGS. 19A to 19C are a perspective view and cross sectional views showing the element structure of the MIS field effect transistor of Fin structure according to the eighth embodiment of this invention, FIGS. 20A to 20D are views showing the manufacturing steps of a MIS field effect transistor of Fin structure, FIGS. 21A to 21D are views showing the manufacturing steps of a MIS field effect transistor of Fin structure, FIGS. 22A to 22D are views showing the manufacturing steps of a MIS field effect transistor of Fin structure, FIGS. 23A to 23D are views showing the manufacturing steps of a MIS field effect transistor of Fin structure, FIG. 24 is a cross sectional view showing the element structure of a modification of this invention, FIG. 25 is a cross sectional view showing the element structure of another modification of this invention.

DETAILED DESCRIPTION OF THE INVENTION

There will now be described embodiments of this invention in detail with reference to the accompanying drawings.

First Embodiment

Figure 1:
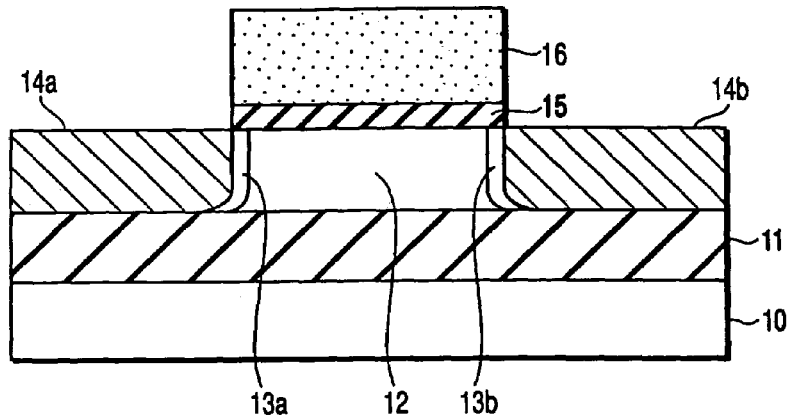
FIG. 1 is a cross sectional view showing the element structure of a MIS field effect transistor according to a first embodiment of this invention.

FIG. 1 is a cross sectional view showing the element structure of a MIS field effect transistor according to a first embodiment of this invention.

A buried insulating film 11 formed of a silicon oxide film is formed on a silicon substrate 10 and first and second semiconductor regions 12, 13 (13a, 13b) and metal source and drain electrodes 14 (14a, 14b) are formed on the buried insulating film 11. A gate electrode 16 is formed above the semiconductor regions 12, 13 with a gate insulating film 15 disposed therebetween.

The first semiconductor region 12 is formed of a p-type layer having boron (B) doped therein, for example, to form a channel region. The second semiconductor regions 13 are each formed of an $n^+$-type layer having As doped therein with high impurity concentration, for example, and formed with extremely thin width to sandwich the first semiconductor region 12 in the channel lengthwise direction. The source and drain electrodes 14 are formed of metal or metal silicide and formed to sandwich the first and second semiconductor regions 12, 13 in the channel lengthwise direction. Thus, the electrodes 14 make Schottky junctions together with the semiconductor regions 13.

The present embodiment has a feature that the impurity concentration of the second semiconductor regions 13 which are used as the source and drain regions is set extremely high and the film thickness thereof is made thin. Thus, the semiconductor region 13 is almost completely depleted. That is, the semiconductor region 13 is formed with such thickness that the whole portion thereof in the channel lengthwise direction will be depleted in a no-voltage application state. More specifically, the second semiconductor region 13 is formed to have thickness smaller than the thickness which is fully or entirely depleted in the channel lengthwise direction when it is set in an equilibrium state with respect to the source electrode. Further, the second semiconductor region 13 may contain a plurality of impurity layers with different impurity concentrations. In addition, HALO regions of low impurity concentration may be provided between the second semiconductor regions 13 and the first semiconductor region 12.

The conditions of the concentration and thickness of the second semiconductor region 13 which satisfy the above condition are as follows. That is, in order to substantially completely deplete the second semiconductor region 13, the thickness thereof may be set equal to or smaller than the thickness of a depletion layer which is formed near the junction surface between the first and second semiconductor regions 12 and 13, and formed near the junction between the second semiconductor region 12 and the source electrode 14. The thickness (W) of the depletion layer can be determined as follows, by using the peak concentration (N) of the second semiconductor region 13.

The depletion layer formed near the junction between the second semiconductor region 13 and the source electrode 14 is known to have a thickness W1, which is approximately:

$$W1=((2 \cdot \epsilon_s \cdot \phi_b)/(q \cdot N))^{1/2} \tag{1}$$

where $\epsilon_s$ is a dielectric constant of semiconductor, $\phi_b$ is the height of a Schottky barrier provided at the semiconductor interface, q is an elementary charge. As in known in the art, $\phi_b$ ranges from 0 to Eg. Substituting the average, Eg/2, for $\phi_b$ in the equation (1), we obtain:

$$W1=\{(\epsilon_s \cdot E_g)/(q \cdot N)\}^{1/2} \tag{2}$$

The depletion layer formed near the junction between the first semiconductor region 12 and the second semiconductor region 13 is known to have a thickness W2 of the following approximate value:

$$W2=\{(2 \cdot \epsilon_s \cdot V_{bi}/q) \cdot (N_{12}+N_{13})/(N_{12} \cdot N_{13})\}^{1/2} \tag{3}$$

where $\epsilon_s$ is a dielectric constant of semiconductor, $N_{12}$ is the impurity concentration of the semiconductor region 12, $N_{13}$ is the impurity concentration of the semiconductor region 13, $V_{bi}$ is the built-in potential at the interface between the semiconductor regions 12 and 13, and q is an elementary charge. It is shown that $V_{bi}$ is about Eg when if the regions 12 and 13 have high impurity concentration. Using N to represent both $N_{12}$ and $N_{13}$, we can reduce Equation (3) to the following:

$$W2=2 \cdot \{(\epsilon_s \cdot E_g)/(q \cdot N)\}^{1/2} \tag{4}$$

W2 here is the total thickness of the depletion layers provided in the semiconductor regions 12 and 13. Hence, the depletion layer provided in the semiconductor region 12 only has thickness W3 that is half the total thickness of the regions 12 and 13. Thus:

$$W3=\{(\epsilon_s \cdot E_g)/(q \cdot N)\}^{1/2} \tag{5}$$

Since $W=W1+W3$:

$$W=2 \cdot \{(\epsilon_s \cdot E_g)/(q \cdot N)\}^{1/2} \tag{6}$$

where $\epsilon_s$ denotes a dielectric constant of semiconductor, Eg denotes a band gap of semiconductor, and q denotes an elementary charge. Further, the impurity concentration N is the concentration of activated impurity. Therefore, the range of the thickness to which the second semiconductor region 13 can be set is expressed by the following expression.

$$L \leq 2 \cdot \{(\epsilon_s \cdot E_g)/(q \cdot N)\}^{1/2} \tag{7}$$

The relation (7) can be rewritten to another relation (8), by using distance L between the source electrode 14 and the lower surface of the gate electrode 16. In a transistor for use as the fundamental element of LSIs, the electric field emanating from the gate electrode is assumed be extremely intense in the channel region. Hence, the semiconductor region 13, which lies beneath the gate electrode 16, can be regarded as depleted due to the gate electric field. It follows that the present invention can be achieved if distance L between the source electrode 14 and the lower surface of the gate electrode 16 is equal to or less than the value W given by the equation (7).

$$L \leq 2 \cdot \{(\epsilon_s \cdot E_g)/(q \cdot N)\}^{1/2} \tag{8}$$

Figure 2:
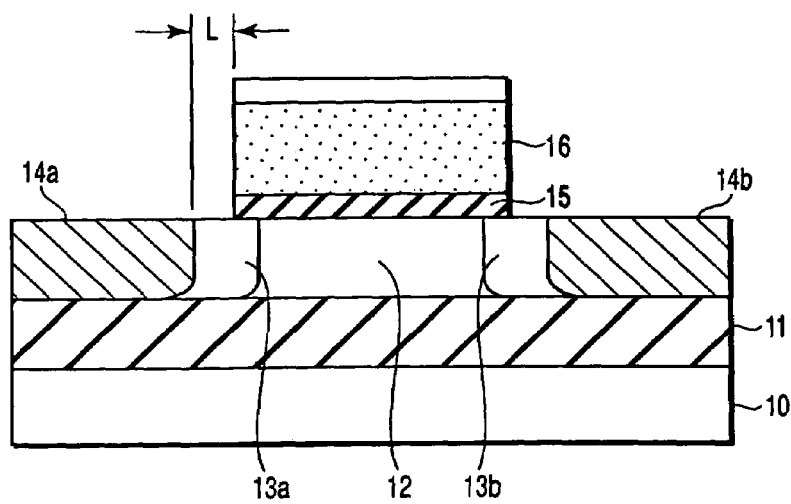
FIG. 2 is a sectional view depicting the structure of the MIS field effect transistor according to the first embodiment of the invention.

FIG. 2 shows a structure that satisfies this relation.

In practice, it is desired that the second semiconductor region 13 have thickness of 10 nm or less thick or impurity concentration of $4 \times 10^{19}$ cm$^{-3}$ or more. This is because the present invention aims at modulate the Schottky barrier of the source electrode, as will be described with reference to FIG. 3 to FIG. 6.

Figure 3:
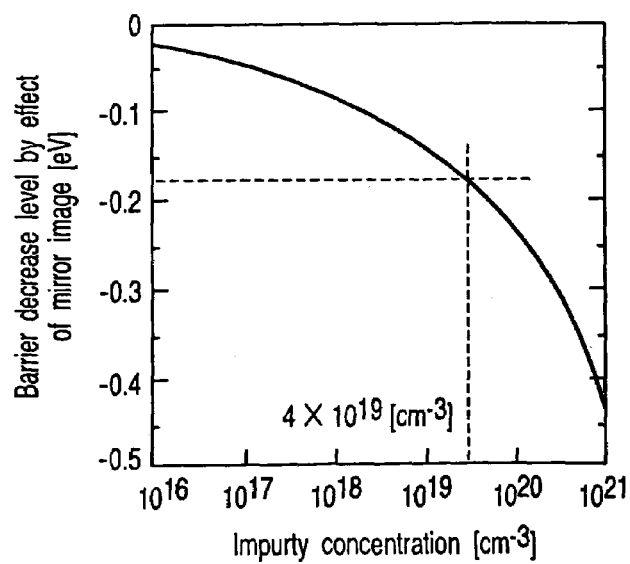
FIG. 3 is a diagram representing the relation between the impurity concentration and the barrier height lowered, which is observed in the MIS field effect transistor.
Figure 4:
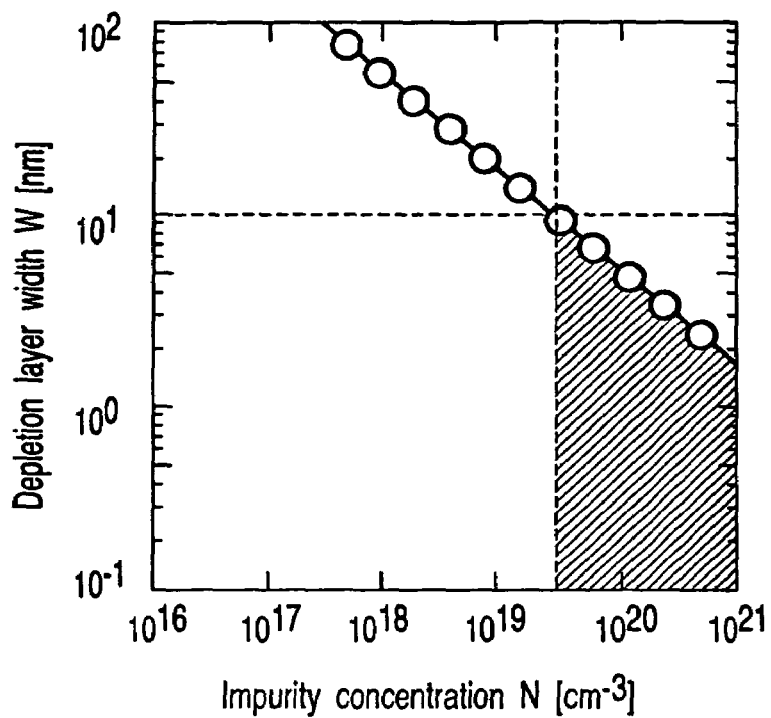
FIG. 4 is a characteristic diagram showing the relation between the impurity concentration and the width of a depletion layer.

FIG. 3 illustrates the mechanism that is used in this invention in order to modulate the Schottky barrier. The region near the interface is doped with impurities, thereby decreasing the Schottky barrier even more. The effect of decreasing the Schottky barrier greatly depends on the impurity concentration. To decrease the Schottky barrier by about three times of the thermal-excitation energy (about 0.06 eV for Si of a working transistor) that is believed to decrease the Schottky barrier sufficiently, the impurity concentration should be $4 \times 10^{19}$ cm$^{-3}$ or more. FIG. 4 shows the relation (8) that is applied to the case where the substrate is made of Si and the transistor is used at 300 K. In FIG. 4, the shaded region indicates the relation that the impurity concentration and thickness of the second semiconductor region 13 need to have. Namely, it is desired that the second semiconductor region 13 should have thickness of 10 nm or less or impurity concentration of $4 \times 10^{19}$ cm$^{-3}$ or more. More preferably, the impurity concentration should be $1 \times 10^{20}$ cm$^{-3}$ or more. In view of this, the second semiconductor region 13 of this embodiment is 4 nm thick and has impurity concentration of $1 \times 10^{20}$ cm$^{-3}$ or more. The region 13 is therefore completely depleted. These conditions are relatively close to the border of the shaded region illustrated in FIG. 4. Nonetheless, the embodiment has been confirmed to exhibit good characteristics as expected. This proves the reliability of the relation (8). The complete depletion of the second semiconductor region 13 can be confirmed based on the measurement of the junction capacitance, the measurement of concentration by EDX or the like, for example.

Figure 5:
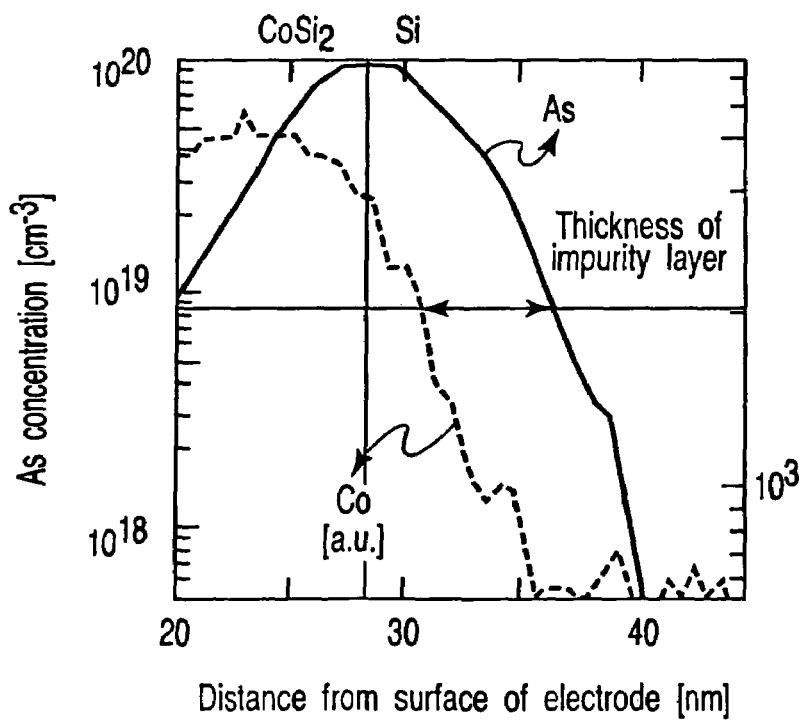
FIG. 5 is a diagram illustrating the relation between the distance from the electrode surface and the As concentration, which is observed in the MIS field effect transistor.

How the SIMS measurement can determine whether the structure can achieve the advantages of this invention will be described. FIG. 5 represents the SIMS profile of As and Co used in the source and drain electrodes of the first embodiment of the present invention. The Co film formed by sputtering is 120 A thick before silicide is formed. The SIMS profile makes the tiny dents and protrusions at the interface look more prominent than they are. This renders it difficult to determine the thickness of an impurity-doped layer correctly, even though the peak impurity concentration of each layer is known. Nevertheless, the following method can estimate the thickness of the impurity-doped layer.

First, the decreasing rate of As concentration and that of Co, in the vicinity of the interface, are set at the same value. This is necessary because the dents and protrusions correspond to the dents and protrusions at the $CoSi_2$ electrode. More precisely, the profiles of the As and Co concentrations are made parallel to each other by means of semi-logarithm plotting. The offset of one profile with respect to the other indicates the thickness of the junction. Depending upon the manufacturing process employed, the surface region of the electrode may have a higher impurity concentration than the metal source interface. This is not so important in this invention. The impurity concentration near the metal interface is important in the present invention. The peak impurity concentration in the vicinity of the metal interface is therefore important.

Figure 6:
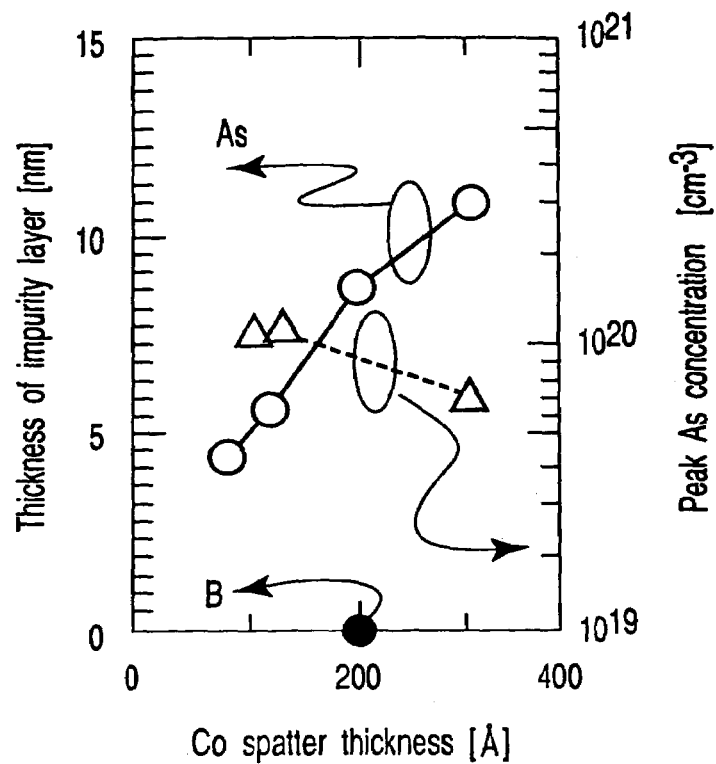
FIG. 6 is a diagram showing the relation between the thickness of a sputtered layer and that of an impurity layer, on the one hand, and the peak As concentration, on the other, which is observed in the MIS field effect transistor.

FIG. 6 shows the relation between the amount of metal sputtered, on the one hand, the impurity concentration and thickness of an impurity-doped layer, which is observed if As and B are used as impurities and the metal electrode is made of Co silicide.

The SIMS-measuring method described above can hardly find the impurity profile in the horizontal direction, when the horizontal impurity profile differs from the impurity profile at the bottom of the device. Nonetheless, the present invention is concerned with the peak impurity concentration in the vicinity of the metal interface. Thus, no problems will arise if use is made of the peak impurity concentration at the bottom of the device, which can be measured by the SIMS measurement.

Moreover, if the relation (8) is applied, whether the structure can easily achieve the advantages of the invention can be determined from the peak impurity concentration at the bottom, measured by SIMS, and the distance between the source electrode and the lower surface of the gate electrode, measured by sectional. TEM or the like.

If the impurity concentration is determined by the SIMS measurement, however, it should be taken into account that the impurity concentration thus determined does not always represents the concentration of activated impurities. Hence, if the impurity concentration is comparatively high, which much concerns with this invention, the ratio of the impurities activated to the impurities not activated must be applied to the impurity concentration determined by the SIMS measurement.

As described above, if an attempt is made to dope impurity into a thin region with extremely high concentration, it becomes extremely difficult to control the concentration and depth. However, if the segregation junction forming method described herein is used, for example, the above control operation can be extremely easily performed.

Figure 7A:
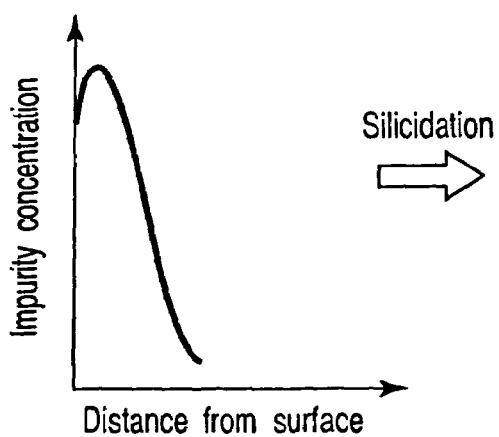
FIGS. 7A, 7B are diagrams for schematically illustrating the principle of a segregation junction forming method.
Figure 7B:
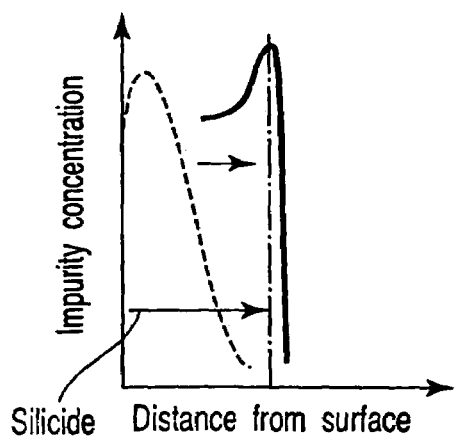

FIGS. 7A, 7B illustrate the principle of the segregation junction forming method. When the semiconductor substrate containing impurity is silicided (or converted into a silicide form), impurity of extremely high concentration can be doped into a thin region by use of a segregation phenomenon if a deep region which is deeper than the ion-implanted region is silicided. That is, as shown in FIG. 7A, if a portion is silicided to depth which is larger than the implantation depth (at which the impurity concentration reaches its peak) after impurity is ion-implanted into a shallow portion near the surface, then an impurity region of high concentration can be formed in an extremely narrow range from the end portion of the silicide as shown in FIG. 7B. This is because impurity diffusion does not occur at temperatures at which the siliciding process is performed and the junction depth and impurity concentration can be controlled based on the segregation phenomenon occurring at the time of siliciding. Even if the impurity concentration and depth vary in the first ion-implantation process, the influence thereof can be suppressed to minimum.

The structure of the MIS field effect transistor according to the present embodiment can be regarded as a transistor in which the source and drain regions formed of the second semiconductor regions 13 have extremely small thickness and high impurity concentration and the regions are completely depleted. This means that the advantage of the Schottky junction that carrier can be implanted at high speed and the resistance to the short channel effect is high and the advantage of the pn junction that a leak current is small can be simultaneously attained. Therefore, as shown in FIG. 8, the Vg-Id characteristic of the transistor according to the present embodiment indicates that a leak current is extremely small in comparison with that of the Schottky transistor and the resistance to the short channel effect is high in comparison with that of the conventional transistor.

As the particularly desirable structure of the present embodiment, the following structure can be provided.

(1) The first semiconductor region 12 is a p-type layer and the second semiconductor region 13 is an n+-type layer.

(2) The width W of the depletion layer determined by the impurity concentration is defined as follows if the impurity concentration of the second semiconductor region 13 is N, the dielectric constant is $\epsilon_s$, the band gap is Eg and the elementary charge is q.

$$W = 2 \cdot (\epsilon_s \cdot Eg/q \cdot N)^{1/2}$$

(3) The impurity concentration N of the second semiconductor region 13 is set to $4 \times 10^{19}$ cm$^{-3}$ or more.

(4) The first, second semiconductor regions 12, 13 and source and drain electrodes 14 are formed on the insulating layer 11.

(5) The first, second semiconductor regions 12, 13 are formed of Si and the source and drain electrodes 14 are formed of metal or metal silicide.

(6) The distance between the source electrode 14 and the lower surface of the gate electrode 16 is equal to or smaller than the width of the depletion layer.

Second Embodiment

FIGS. 9A to 9F are cross sectional views showing the manufacturing steps for forming a MIS field effect transistor according to a second embodiment of this invention. In this embodiment, a case wherein the transistor is formed on an Si substrate instead of the SOI substrate is shown.

First, as shown in FIG. 9A, a silicon substrate 20 (which is hereinafter simply referred to as a substrate) having the plane orientation (100) and specific resistance 2 to 6 Ωcm is prepared. Then, an isolation region (not shown) is formed by use of a known method and a p-type impurity region (first semiconductor region) 22 which is used as a channel is formed by use of an ion-implantation method or the like.

Next, as shown in FIG. 9B, a silicon oxide film with a film thickness of 1 to 10 nm is formed on the surface of the first semiconductor region 22 by use of an oxide film forming method (which is hereinafter referred to as an oxide film forming method) as will described later. The silicon oxide film is used as a gate insulating film 25. At this time, if the silicon oxide film is converted into a silicon oxynitride film by use of an oxide film nitriding method (which is hereinafter referred to as an oxide film nitriding method) as will described later, punchthrough of impurity from a gate electrode which is formed later can be prevented.

Next, as shown in FIG. 9C, a polysilicon film is deposited by use of a low pressure chemical vapor deposition (LP-CVD) method or the like. Then, a gate electrode 26 and gate side wall insulating films 27 are formed by use of a known lithography process and patterning technique.

Figure 9D:
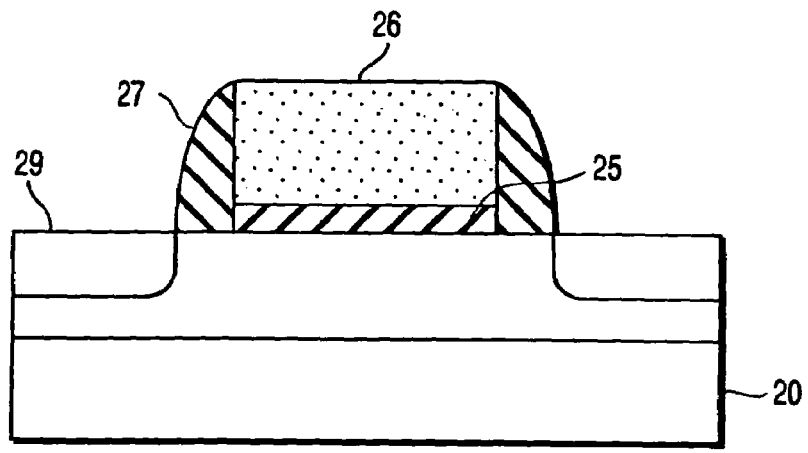

After this, as shown in FIG. 9D, an ion-implantation process of As, for example, is performed in a condition of acceleration voltage of 30 keV and dose amount of $2 \times 10^{15}$ cm$^{-2}$, for example, so as to form an impurity layer 29 of high impurity concentration on the first semiconductor region 22.

Figure 9E:
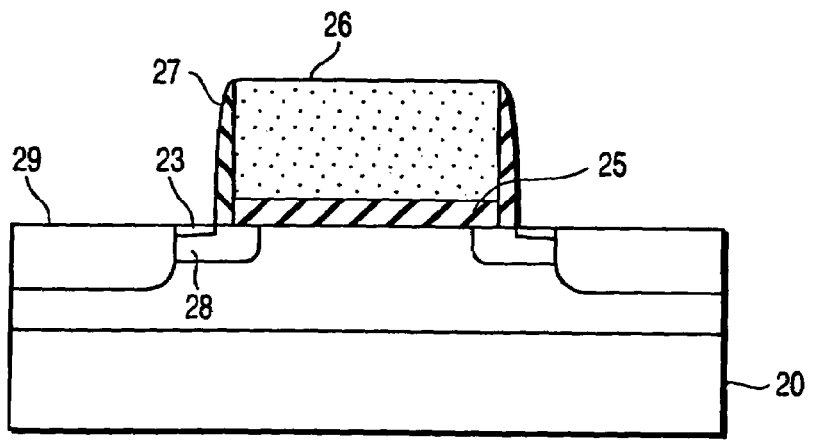

Next, as shown in FIG. 9E, the gate side wall insulating films 27 are etched and made thin by use of a known RIE method or the like. Then, an ion-implantation process of B, for example, is performed in a condition of acceleration voltage of 40 keV and dose amount of $5\times10^{14}$ cm$^{-2}$, for example, so as to form HALO regions 28 between the channel region and the high-concentration impurity regions 29. Further, an ion-implantation process of As, for example, is performed in a condition of acceleration voltage of 1 keV and dose amount of $1\times10^{15}$ cm$^{-2}$, for example, so as to form high-concentration impurity regions 23 (second semiconductor regions) on the HALO regions 28 between the channel region and the high-concentration impurity regions 29. After this, the thus doped impurities are activated by use of a known technique such as a RTA or FLA method. At this time, if the segregation junction forming method described before is used, the thickness of the high-concentration impurity regions 23 is made smaller than the thickness of metal electrodes which are formed by the next siliciding step.

Figure 9F:
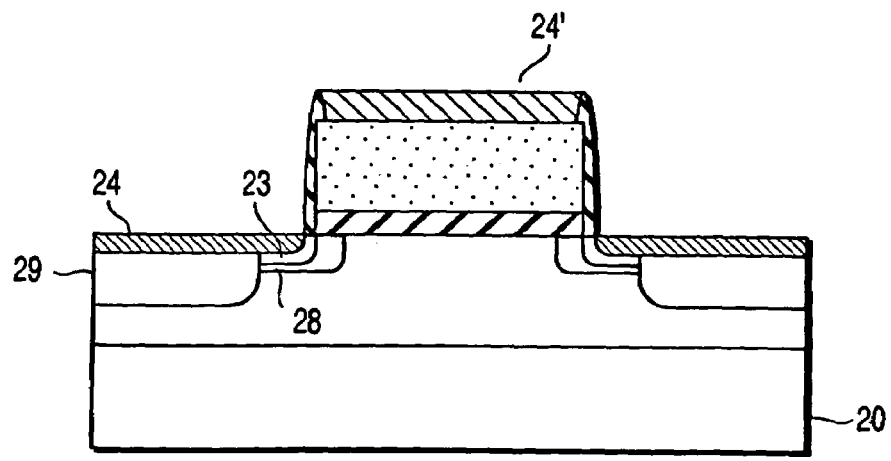

Next, as shown in FIG. 9F, a metal film of nickel (Ni), for example, is formed to a thickness of approximately 10 nm by a sputtering method or the like. Then, the thus formed metal film is annealed at temperatures of 300 to 500° C. for approximately 30 to 200 seconds and after it is converted into a silicide form, non-reacted Ni is removed to form metal electrodes 24. The second semiconductor regions 23 are pushed out towards the first semiconductor region 22 while the metal electrodes 24 are being formed. Thus, portions of the second semiconductor regions 23 which have extremely small thickness and high impurity concentration are formed between the channel region and the metal electrodes 24.

In the present embodiment, a silicide film 24' is formed on the gate electrode 26, but the silicide film is formed because the Ni film is also formed on the gate electrode 26. If a mask is formed on the gate electrode 26 at the time of formation of the Ni film, silicide films can be formed only on the source and drain like the first embodiment. Further, if Ni or Co is sputtered and then converted into a silicide form, the film thickness thereof becomes approximately three times that of a single metal film in the case of Ni silicide and becomes approximately two times that of a single metal film in the case of Co silicide.

Like the first embodiment, in the field effect transistor thus formed, the source and drain regions formed of the second semiconductor regions 23 have extremely small film thickness and high impurity concentration. Further, the field effect transistor can be regarded as a transistor in which the above regions are completely depleted. Therefore, like the first embodiment, the parasitic resistance of the source and drain portions can be reduced, the short channel effect can be suppressed and a leak current can be reduced.

Next, the oxidation film forming method, nitride film/oxynitride film forming method and oxide film nitriding method are explained.

[Example of Oxidation Film Forming Method]

As the oxidation film forming method, for example, a direct oxidation method in which a film is heated to approximately 900° C. in an atmosphere containing oxygen gas, for example, can be used. Alternatively, a radical oxidation method in which a film is heated to the room temperature to approximately 800° C. in an oxygen radial atmosphere, for example, can be used. Further, it is also possible to use a CVD method in which a film is formed by reacting halogen-added silicon hydride $SiH_xD_yCl_zF_{4-x-y-z}$ ((each of x, y, z is a desired positive integer of 0 to 4 which does not make (4-x-y-z) negative)) or halogen-added silicon hydride $Si_2H_xD_yCl_zF_{6-x-y-z}$ ((each of x, y, z is a desired positive integer of 0 to 6 which does not make (6-x-y-z) negative)) with oxygen ($O_2$) gas, ozone ($O_3$) gas, oxynitride (NO) gas, nitrous oxide (($N_2O$) gas or oxygen radical.

[Example of Oxide Film Nitriding Method]

As an example of the oxide film nitriding method, a direct nitriding method in which a film is heated to approximately 900° C. in an atmosphere of $NH_xD_yF_{1-x-y}$, for example, can be used. Alternatively, a radical nitriding method in which a film is heated to the room temperature to approximately 800° C. in a nitrogen radial atmosphere, for example, can be used. Further, a post nitriding method in which a film is nitrided by use of ammonium ($NH_3$), NO, $N_2O$ or the like. In addition, it is also possible to use a CVD method in which a film is formed by reacting $SiH_xD_yCl_zF_{4-x-y-z}$ or $Si_2H_xD_yCl_zF_{6-x-y-z}$ with $NH_xD_yF_{1-x-y}$ or nitrogen radical.

[Nitride Film/Oxynitride Film Forming Method]

In the present embodiment, the oxynitride film is formed by use of a combination of the direct oxidation method and radical nitriding method. However, even if the film is formed by use of a film forming method such as a laser application method, sputtering method, reactive sputtering method, CVD method or single atomic layer sequential deposition method (atomic layer deposition method), the method can be applied in exactly the same manner as described above.

Further, as the insulating film, an example using the silicon oxide film, nitride film or oxynitride film is shown. However, for example, an oxide film, nitride film or oxynitride film of hafnium (Hf), zirconium (Zr), lanthanum (La), selenium (Se) or a film of alumina ($Al_2O_3$), aluminum nitride (AlN) or aluminum oxynitride (AlON) can be used as the insulating film. In this case, the insulating film can be used in the same manner as described above.

Third Embodiment

Figure 10:
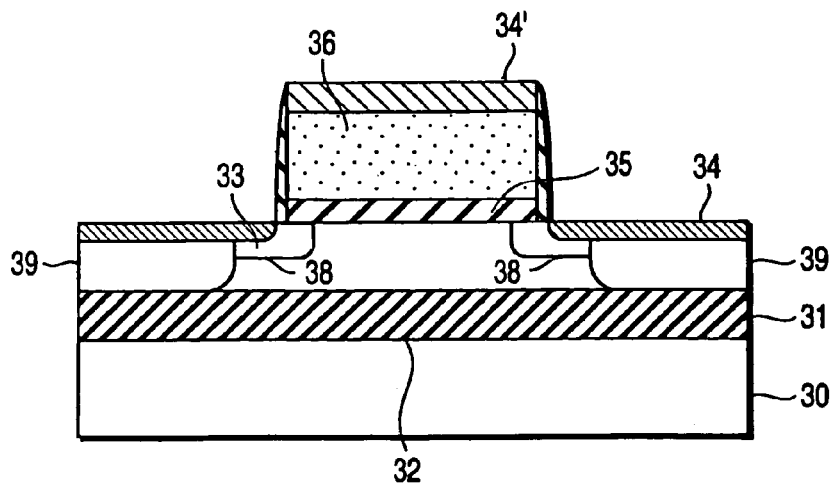
FIG. 10 is a cross sectional view showing the element structure of a MIS field effect transistor according to a third embodiment of this invention.

FIG. 10 is a cross sectional view showing the element structure of a MIS field effect transistor according to a third embodiment of this invention.

The present embodiment can be attained by using an SOI substrate which is the same as that of the first embodiment in the second embodiment. That is, a buried insulating film 31 such as a silicon oxide film is formed on a silicon substrate 30. Then, a first semiconductor region 32, second semiconductor region 33, source and drain regions 34, gate insulating film 35, side wall insulating films 37, HALO regions 38 and high-concentration impurity layer 39 are formed on the structure.

Thus, the present embodiment has basically the same configuration as that of the second embodiment except that the SOI substrate is used and the manufacturing method thereof is basically the same as that of the second embodiment. Therefore, the same effect as that of the second embodiment can be attained.

Fourth Embodiment

Figure 11:
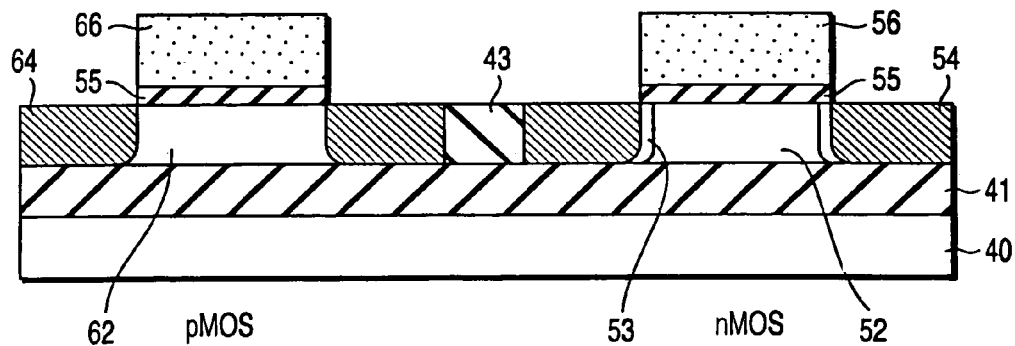
FIG. 11 is a cross sectional view showing the element structure of a MIS field effect transistor according to a fourth embodiment of this invention.

FIG. 11 is a cross sectional view showing the element structure of a MIS field effect transistor according to a fourth embodiment of this invention. The present embodiment shows a case wherein this invention is applied to the CMOS structure. In this case, this invention can be applied to both of pMOS and nMOS portions. However, in order to explain another effect attained by applying this invention, a case wherein the transistor is combined with a Schottky transistor is explained.

An example of the CMOS structure of the present embodiment includes a p-type impurity region 52 and n-type impurity region 62 formed on an SOI substrate 40, n-type high-concentration impurity regions 53, metal source and drain electrodes 54, 64 formed of Pt silicide, gate insulating films 55, 65, gate electrodes 56, 66 and an isolation region 43.

More specifically, a buried insulating film 41 formed of a silicon oxide film, for example, is formed on the silicon substrate 40 and a semiconductor layer of Si or the like is formed on the structure. The semiconductor layer is divided by the isolation region 43, n-type impurity is doped into the pMOS forming region and p-type impurity is doped into the nMOS forming region. Like the first embodiment, the second semiconductor region 53 having n-type impurity doped therein with high concentration and the source and drain electrodes 54 formed of Pt silicide are formed on the side surfaces of the first semiconductor region 52 which is a semiconductor layer having p-type impurity of the nMOS forming region doped therein. Further, the gate electrode 56 is formed above the semiconductor regions 52, 53 with the gate insulating film 55 disposed therebetween. Thus, an nMOS transistor which is the same as that of the first embodiment is formed.

On the other hand, the source and drain electrodes 64 formed of Pt silicide which are used as Schottky electrodes are formed on the side surfaces of the third semiconductor region 62 having n-type impurity of the pMOS forming region doped therein. Further, the gate electrode 66 is formed above the semiconductor region 62 with the gate insulating film 65 disposed therebetween. Thus, a pMOS Schottky transistor is formed.

As described before, the Schottky transistor has an excellent advantage, but at the same time, it has a disadvantage that the leak current is large and the operation current is small. The disadvantage can be compensated for by changing a metal material of the source and drain. For example, it is known that the pMOS portion using Pt silicide as the electrode exhibits an excellent characteristic which is as good as that of the conventional element. However, since the effect attained by the above compensation contradictorily acts on carriers, it is impossible to use Pt silicide to form the source and drain of the nMOS portion. When considering this problem, it is necessary to use different metal materials for the pMOS and nMOS portions in order to realize a CMOS structure by use of the Schottky transistor. However, in this case, it becomes extremely difficult to form the element.

Therefore, in the present embodiment, as shown in FIG. 11, the structure having the pMOS portion formed of the Schottky transistor of Pt silicide and the nMOS portion which is a transistor according to the present invention is used. Thus, since the preferable characteristic can be exhibited by the effect of this invention even when Pt silicide is used to form the nMOS portion, it becomes possible to realize the CMOS structure by using only Pt silicide as the electrode metal material.

Likewise, a CMOS structure in which this invention is applied to the pMOS portion can be realized by using a metal material (such as Er silicide or Yb silicide) which exhibits the preferable characteristic when it is used for the nMOS portion.

As a particularly preferable structure in the present embodiment, the following structure can be given.

(1) The thickness of the second semiconductor region 53 in the channel lengthwise direction is set to 10 nm or less and is set smaller than the depletion layer width determined by the impurity concentration.

(2) The depletion layer width W determined by the impurity concentration is defined as follows when the impurity concentration of the second semiconductor region 53 is N, the dielectric constant is $\epsilon_s$, the band gap is Eg and the elementary charge is q.

$$W = 2 \cdot (\epsilon_s \cdot Eg/q \cdot N)^{1/2}$$

(3) The first semiconductor region 52 is a p-type layer, the second semiconductor region 53 is an n$^+$-type layer and the third semiconductor region is an n-type layer.

(4) The impurity concentration N of the second semiconductor region 53 is set equal to $4 \times 10^{19}$ cm$^{-3}$ or more.

(5) The first, second and third semiconductor regions 52, 53 and 62 and the source and drain electrodes 54, 64 are formed on the insulating layer.

(6) The first, second and third semiconductor regions 52, 53 and 62 are formed of Si and the source and drain electrodes 54, 64 are formed of metal or metal silicide.

(7) The distance between the source electrode 54 and the lower surface of the gate electrode 56 is equal to or less smaller than the width of the depletion layer.

Fifth Embodiment

Figure 12:
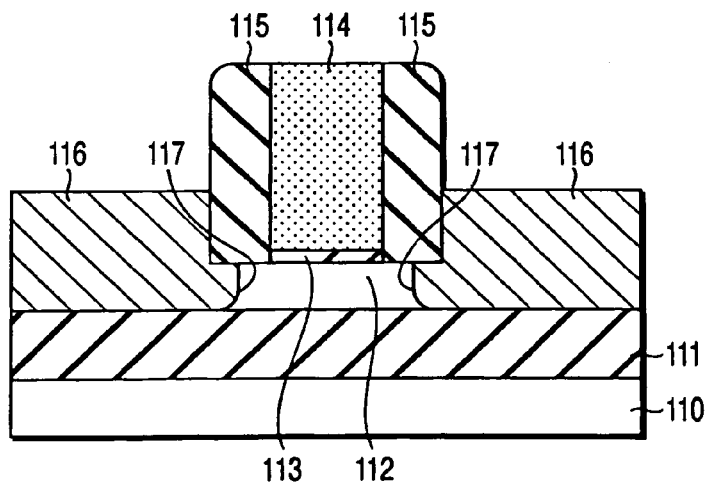
FIG. 12 is a cross sectional view showing the element structure of a MIS field effect transistor according to a fifth embodiment of this invention.

FIG. 12 is a cross sectional view showing the element structure of a MIS field effect transistor according to a fifth embodiment of this invention.

A buried insulating film 111 formed of a silicon oxide film or the like is formed on a silicon substrate 110 and a channel region 112 is formed on the buried insulating film 111. Further, a gate electrode 114 is formed above the channel region 112 with a gate insulating film 113 disposed therebetween. In addition, gate side wall insulating films 115 are formed on the channel region 112. Source and drain electrodes 116 are formed to sandwich the channel region 112. The feature of this invention lies in that impurity which modulates or adjusts the height of the Schottky barriers is contained with high impurity concentration in interface portions 117 between the channel region 112 and the source and drain electrodes 116.

The essence of the present embodiment is that the height of the Schottky barriers of the source and drain electrodes is modulated by use of the interface portions 117. It is understood that the height of the Schottky barriers of the source and drain electrodes is substantially determined by the material thereof, and therefore, it is difficult to control the height to a desired value. However, in practice, the height of the Schottky barrier is substantially determined by the property of the interface portion and it becomes possible to modulate the height of the Schottky barrier by doping impurity into the interface portion.

As described above, according to the present embodiment, the height of the Schottky barrier of the source and drain can be freely controlled according to impurity contained in the interface portion 117. Therefore, the optimum height of the Schottky barrier can be set irrespective of the metal material of the source and drain and the transistor characteristic can be enhanced.

More specifically, the height of the Schottky barriers in the interface portions between the first semiconductor region and the source and drain electrodes can be freely controlled by setting the impurity concentration of the source and drain electrodes higher than the impurity concentration of the channel region and setting the peaks of the impurity concentration in the interface portions between the first semiconductor region and the source and drain electrodes. Thus, a field effect transistor which has an extremely small leak current and is highly resistant to the short channel effect can be realized.

Further, in the present embodiment, the resistance to the short channel effect can be further enhanced by making a structure in which impurity is prevented from being diffused into the semiconductor side. Even if the position and amount of impurity vary to some extent for each element, it is possible to attain an advantage that the influence thereof can be suppressed to minimum.

Sixth Embodiment

Figure 13:
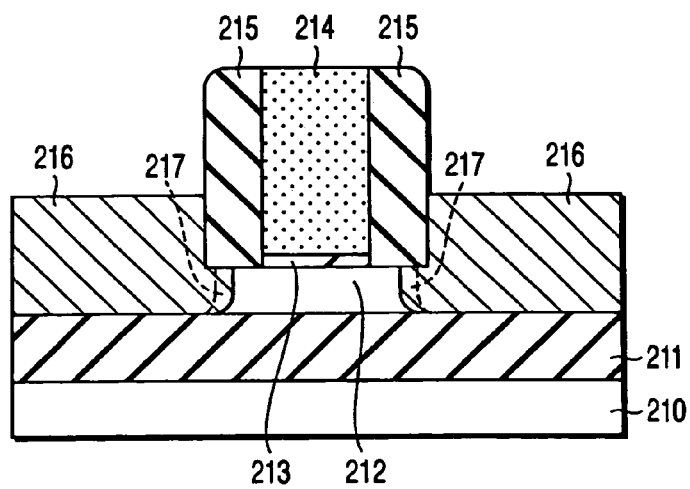
FIG. 13 is a cross sectional view showing the element structure of a MIS field effect transistor according to a sixth embodiment of this invention.

FIG. 13 is a cross sectional view showing the element structure of a MIS field effect transistor according to a sixth embodiment of this invention.

A buried insulating film 211 formed of a silicon oxide film or the like is formed on a silicon substrate 210 and a channel region 212 is formed on the buried insulating film 211. Further, a gate electrode 214 is formed above the channel region 212 with a gate insulating film 213 disposed therebetween. In addition, gate side wall insulating films 215 are formed on the channel region 212. Source and drain electrodes 216 are formed to sandwich the channel region 212. The feature of this invention lies in that interface neighboring regions 217 between the channel region 212 and the source and drain electrodes 216 contain impurity which modulates or adjusts the height of the Schottky barriers with impurity concentration higher than impurity of the channel region 212.

In the present embodiment, impurity contained in the interface neighboring regions 217 to modulate the height of the Schottky barriers also modulates the height of the Schottky barriers of the source and drain electrodes 216. On the other hand, impurity is present in the metal, but this does not deteriorate the effect of the fifth embodiment. Therefore, the present embodiment can be regarded as having substantially the same structure as that of the fifth embodiment.

Figure 14:
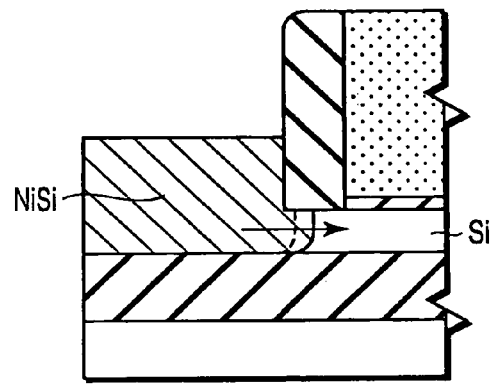
FIG. 14 is a cross sectional view showing the element structure in which NiSi is used to form source and drain portions.
Figure 15:
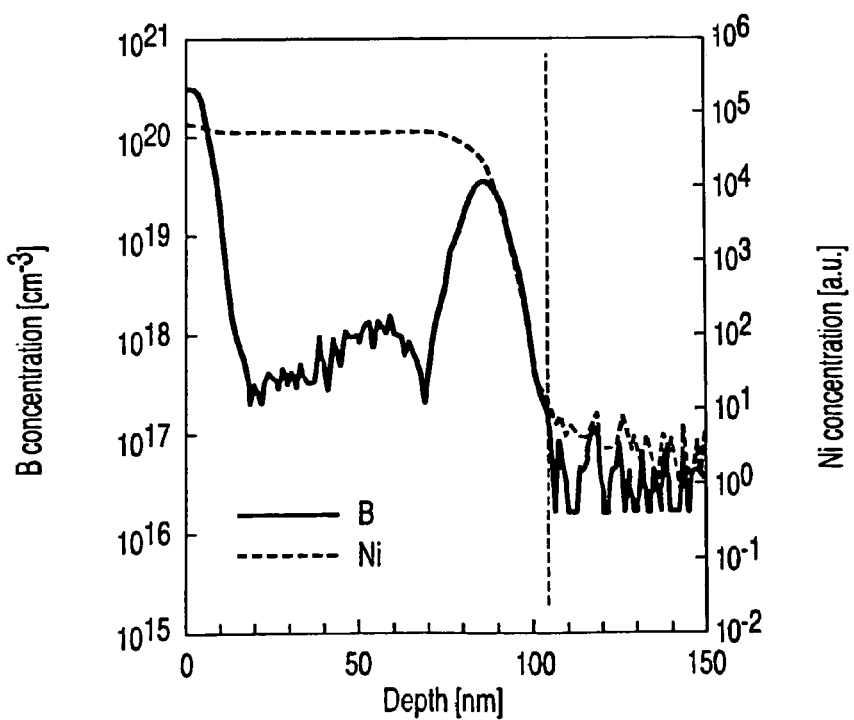
FIG. 15 is a diagram showing the measurement values of SIMS profiles of Ni and B of the source and drain portions.

As one example of the sixth embodiment, an example of the structure and characteristic obtained when the source and drain electrodes are formed of NiSi and B (boron) is used as the impurity which modulates the height of the Schottky barriers is shown. FIG. 14 is a cross sectional view showing the element structure of this case. FIG. 15 shows the measurement values of SIMS profiles of Ni and B of the source and drain portions. The direction indicated by an arrow shown in FIG. 14 indicates the depth direction.

As is clearly understood from FIG. 15, the Ni concentration profile rapidly drops in a portion near the interface. The concentration of B is higher in the source and drain portions than in the channel region and has peaks in portions near the interfaces between the channel region and the source and drain portions. The reason why the concentration in the interface between metal and semiconductor which originally abruptly varies is observed to have certain width is that the influence by roughness of the interface is given and the resolution of the SIMS measurement has a limitation. By comparing the profile with the profile of Ni, it is understood that B lies in a range from the interface with NiSi to the internal portion and the structure shown in FIG. 14 is formed in a preferable form. In this example, almost no B exists on the Si side. Thus, whether the structure of the present embodiment is attained or not can be checked by measuring the impurity profile of the portion near the interface based on the SIMX analysis or EDX analysis shown in FIG. 15.

Figure 16:
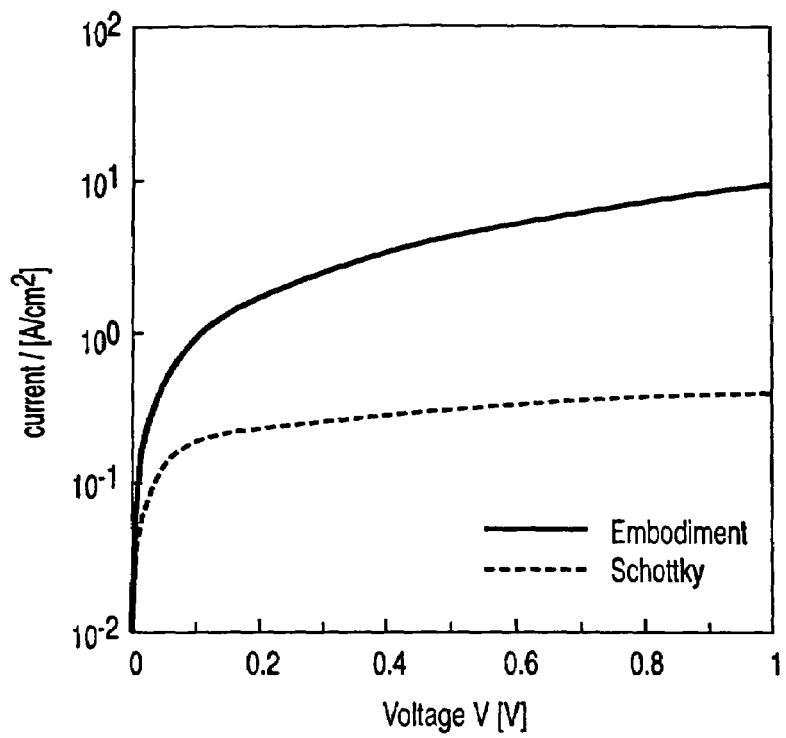
FIG. 16 is a diagram showing the current-voltage characteristic of a Schottky diode in the source/drain portion measured in a reverse-biased condition.

FIG. 16 shows the current-voltage characteristic of a Schottky diode, actually measured in a reverse-biased condition. This diode has a structure similar to the source/drain portion (i.e., a B-doped junction of $CoSi_2$). For comparison, the characteristic (Schottky) in a case where B is not contained is also shown. FIG. 16 indicates the degree of ease with which holes can get over the Schottky barrier and flow. It is understood that holes can extremely easily flow by applying the present embodiment in comparison with the normal Schottky diode. This means that the height of the Schottky barrier is extremely lowered for holes by applying the present embodiment as described before.

In a device manufacturing method in an embodiment which will be described later, a segregation junction forming method is used to form source and drain electrodes. Since the essence of the present embodiment lies in the structure, the source/drain electrode forming method is not particularly limited. However, since the segregation junction forming method is the most suitable source/drain electrode forming method at present, the process thereof is explained in detail here.

The segregation junction forming method includes at least a process for doping impurity into a semiconductor layer, activating the thus doped impurity, doping metal on the semiconductor layer, and reacting the metal with the semiconductor layer by heat treatment to segregate impurity. At this time, the important point is that it is necessary to set various conditions immediately before the step of doping the metal so as to set the thickness of the semiconductor region containing impurity equal to or smaller than the thickness of the finally formed metal layer. Thus, the source and drain electrodes can be preferably formed. Further, the step of activating impurity is not always necessary, but the degree of activation of impurity in the finished device can be made high by carrying out the step and the profile is also changed accordingly.

(Concrete Example of Impurity which Modulates Height of Schottky Barrier and Electrode Material)

In the present embodiment, desired materials can be selected as the material of the source and drain electrodes and the type of impurity which modulates the height of the Schottky barrier. However, when the matching with the conventional process is taken into consideration, it is preferable to use Co silicide, Ni silicide or Pa silicide as the electrode material. In this case, if As (arsenic), P (phosphorus) or Sb (antimony) is used in the case of nMOS or B (boron), In (indium) or Ga (gallium) is used in the case of PMOS as the material which modulates the height of the Schottky barrier, a CMOS structure can be formed simply by changing the ion seed to be implanted without changing the electrode material.

As the impurity which modulates the height of the Schottky barrier, a metal material can be used in addition to the above materials. That is, for example, Er or Yb is implanted in the case of nMOS and Pt is implanted in the case of pMOS and Ni is sputtered to form a silicide film. Then, like the other impurity, Er silicide or Pt silicide is formed near the Si interface together with the Ni silicide and thus the height of the Schottky barrier can be modulated.

Further, since oxygen (O) and nitrogen (N) can be segregated by silicidation, they can be applied to this invention. For example, it is known that an insulating material such as $SiO_2$ or SiN reduces the influence by a Fermi level pinning phenomenon (a phenomenon which makes it difficult to control the height of the Schottky barrier by pinning the Fermi level) if semiconductor is Si. Therefore, in the above case, it is preferable to implant O or N. For the same purpose, an element such as helium (He) or fluorine (F) can be used.

When the electrode material is changed according to the type of transistor, it is of course possible to use a material such as Er silicide or Pt silicide. In this case, it is preferable to use Er silicide for the nMOS portion and use Pt silicide for the pMOS portion. As the type of impurity used at this time, it is preferable to use P, As or antimony for Er silicide or Yb silicide, and use B or indium for Pt silicide.

When the segregation junction forming method described before is used, the profile is greatly changed depending on the ion seed used. Particularly, in order to realize a profile in which a large amount of impurity lies in the metal portion and which is required in this invention, a light element seed such as B (boron) or phosphorus (P) is suitably used. If the profile may extends into the semiconductor, As (arsenic) or In (indium) can be used. In this case, the interface resulting from the segregation of impurities will have high impurity concentration.

Of course, this invention can be applied to the CMOS structure. In this case, it is of course possible to apply this invention to both of pMOS and nMOS portions. However, it is effective to use a Schottky transistor of Pt silicide for the pMOS portion and use an n-type transistor of this invention which utilizes a Pt silicide electrode for the nMOS portion. Further, it is also effective to use a Schottky transistor of Er silicide for the nMOS portion and use an n-type transistor of this invention which utilizes an Er silicide electrode for the pMOS portion. Also, in this case, a high-performance CMOS structure can be realized by use of a single silicide material. In the examples described here, it is of course possible to combine the transistor with a normal MOS transistor without causing any problem.

Seventh Embodiment

FIGS. 17A to 17E are cross sectional views showing the manufacturing steps for forming a MIS field effect transistor according to a seventh embodiment of this invention.

Figures 17A, 17B:
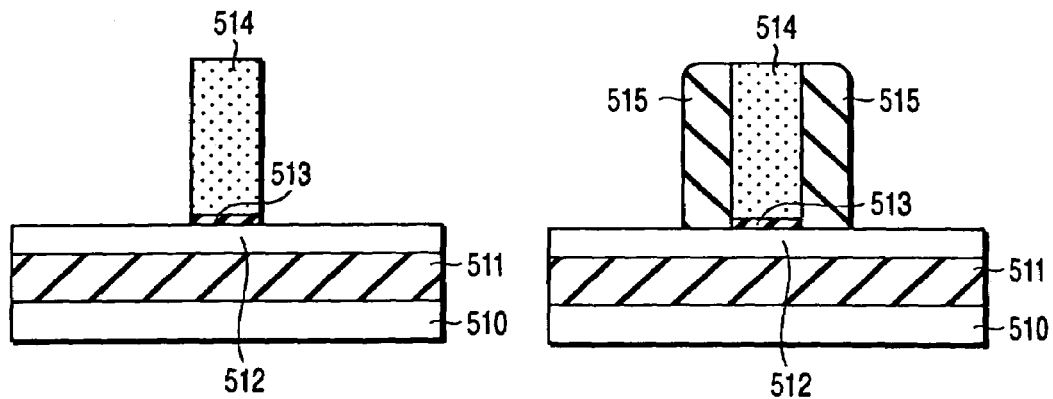
FIGS. 17A to 17E are cross sectional views showing the manufacturing steps for forming a MIS field effect transistor according to a seventh embodiment of this invention.

First, as shown in FIG. 17A, an isolation region (not shown) is formed on an SOI substrate which is formed by forming a silicon layer 512 above a silicon substrate 510 with a BOX oxide film 511 disposed therebetween by use of a known technique. Then, a gate oxide film 513 and gate electrode 514 are sequentially formed on the above structure. If necessary, a post oxidation process is performed at this time (not shown).

Next, as shown in FIG. 17B, after a silicon nitride film is deposited by use of a low pressure chemical vapor deposition (LP-CVD) method or the like, gate side wall silicon nitride films 515 are formed by etching back the above silicon nitride film by use of an RIE method or the like.

Figure 17C:
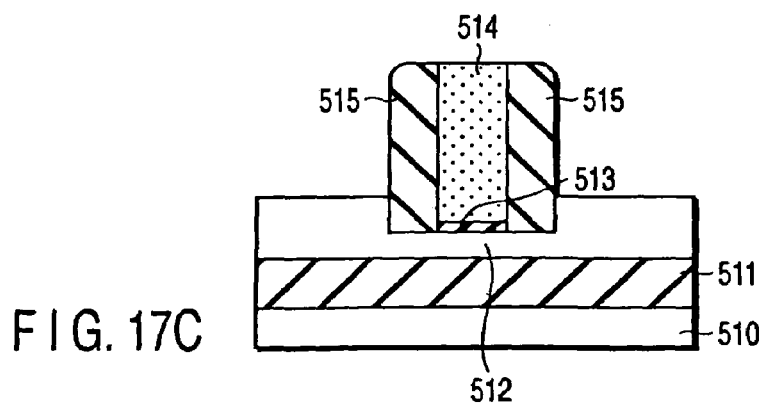

Then, as shown in FIG. 17C, a rising Si layer is epitaxially grown on the silicon layer 512 by selectively growing Si. At this time, the material of the layer can be used to form an SiGe layer.

Figure 17D:
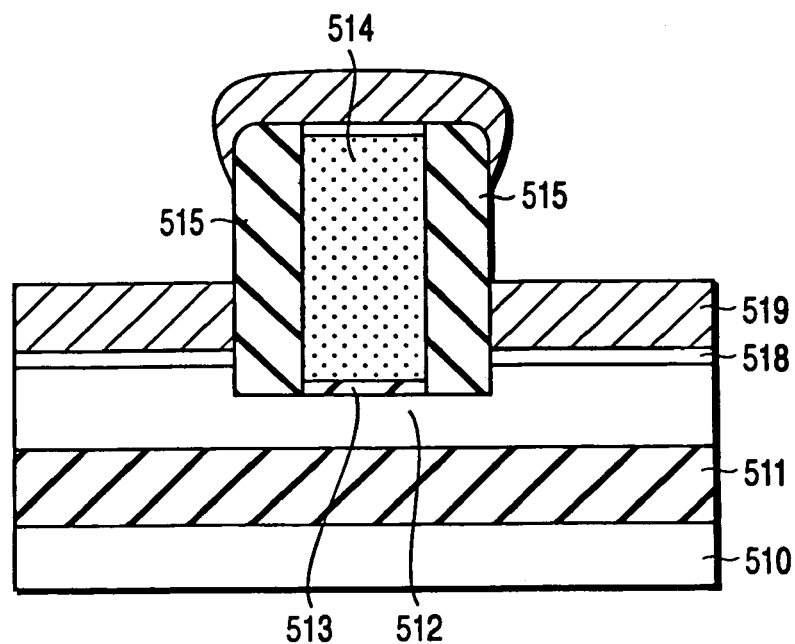

Next, as shown in FIG. 17D, impurity is ion-implanted and activated to form an impurity region 518. Then, a Ni film 519 is formed by a sputtering method or the like.

Figure 17E:
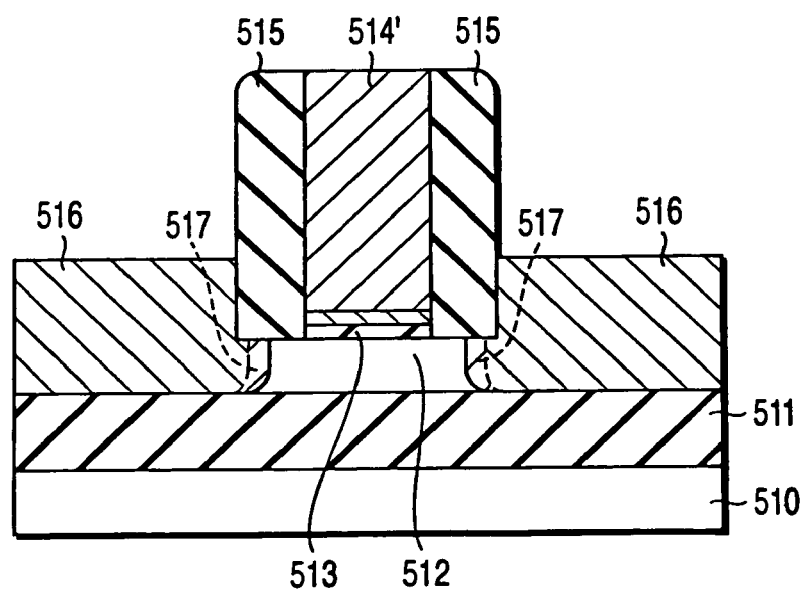

After this, silicidation reaction occurs by carrying out the heat treatment, and as shown in FIG. 17E, source and drain electrodes 516 formed of NiSi and a gate electrode 514' formed of NiSi are formed. At this time, the source and drain electrodes 516 are formed to depth which extends from the surface and reaches the oxide film 511. Likewise, the gate electrode 514' is formed to extend from the surface and reach the gate insulating film 513. Further, at this time, impurity in the impurity region 518 causes segregation in the interface and impurity regions 517 are formed in portions near the interfaces between the channel region 512 and the source and drain regions 516. Then, the structure as shown in FIG. 13 can be formed by removing no n-reacted Ni.

In the present embodiment, the gate electrode is also formed in a metal gate form. If the upper portion of the gate electrode is masked at the time of Ni sputtering, conversion into the metal gate form can be prevented. However, in this case, the work function of the gate is modulated or adjusted by impurity if the structure as shown in FIG. 17E is formed. Therefore, not only the height of the Schottky barrier but also the threshold voltage can be simultaneously adjusted by utilizing the structure of the present embodiment.

Eighth Embodiment

Figure 18B:
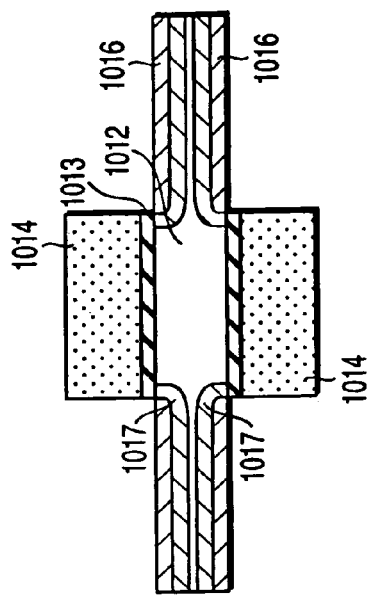
FIGS. 18A to 18C are a perspective view and cross sectional views showing the element structure of a MIS field effect transistor of Fin structure according to an eighth embodiment of this invention.
Figure 18C:
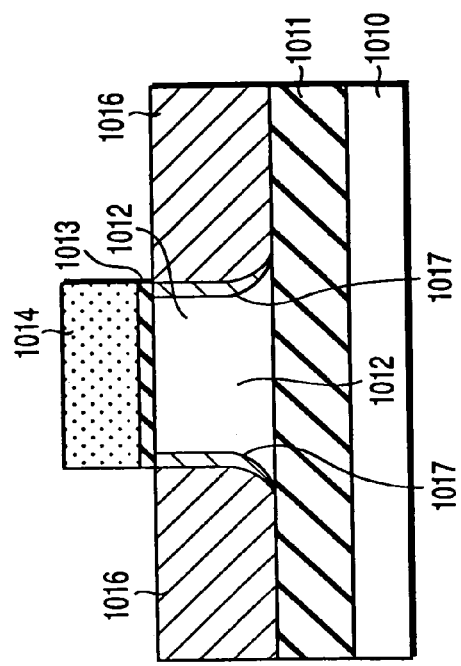
Figure 18A:
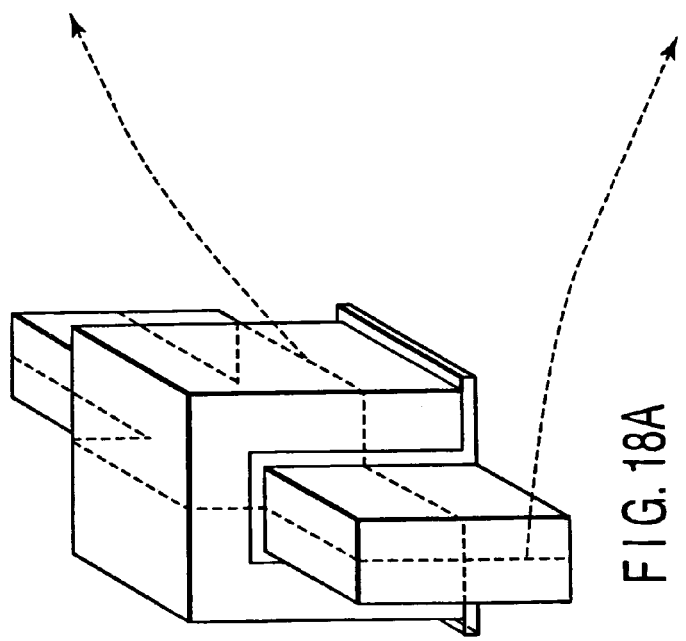

FIGS. 18A to 18C and FIGS. 19A to 19C are views for illustrating a MIS field effect transistor with a Fin structure according to an eighth embodiment of this invention. FIGS. 18A, 19A are perspective views, FIGS. 18B, 19B are horizontal cross sectional views and FIGS. 18C, 19C are vertical cross sectional views.

In FIGS. 18A to 18C and FIGS. 19A to 19C, a reference symbol 1010 denotes a silicon substrate, 1011 a buried insulating film, 1012 a semiconductor layer which forms a channel, 1013 a gate insulating film, 1014 a gate electrode, 1016 source and drain electrodes, and 1017 regions near the interfaces between the channel and the source and drain electrodes 1016.

As is clearly understood from the horizontal cross sectional views of FIGS. 18B and 19B, when this invention is applied to the Fin structure, a shape in which the bottom surfaces of the source and drain electrodes do not exist can be realized. Therefore, a leak current in the bottom surface can be markedly reduced. Further, if a gate all around type is used, a leak current of the bottom surface can be completely eliminated. The element performance obtained when an element other than the element formed on the SOI structure shown in FIG. 13 is formed on a normal substrate can be enhanced.

FIGS. 20A to 20D to FIGS. 23A to 23D are views showing the manufacturing steps of a MIS field effect transistor with a Fin type FET structure. In each drawing, "A" is a plan view, "B" is a cross sectional view of "A", "C" is a cross sectional view of "A" and "D" is a perspective view. In the above embodiments, the number of Fins is set to one for simplicity of the drawings, but when the transistor is used in practice, a transistor having a plurality of Fins indicated here can also be formed.

First, as shown in FIGS. 20A to 20D, an isolation region (not shown) is formed on an SOI substrate 1000 by use of a known technique. Then, silicon layers 1012 used as channel regions (Fins) and a gate oxide film (not shown) are formed on the above structure.

Next, as shown in FIGS. 21A to 21D, a polysilicon film is deposited and patterned to form a gate electrode 1014. In this case, if necessary, the post oxidation process is performed. Then, if a silicon nitride film is formed by the low pressure chemical vapor deposition (LP-CVD) method, for example, and gate side wall silicon nitride films are formed by use of the RIE method or the like, occurrence of bridging between the gate and the source/drain can be easily prevented (not shown).

Next, as shown in FIGS. 22A to 22D, impurity is ion-implanted and activated to form impurity regions 1018. Then, as shown in FIGS. 23A to 23D, a Ni film is sputtered by use of the sputtering method or the like and subjected to the heat treatment. As a result, a silicidation reaction occurs to from source and drain electrodes 1016 formed of NiSi and a gate electrode 1014' formed of NiSi. Further, at this time, impurity in the impurity region is segregated in the interface region to form an impurity region as shown in FIG. 24 in each of the source and drain electrodes 1016. Finally, non-reacted Ni is eliminated to complete an Fin type FET structure.

(Modification)

This invention is not limited to the above embodiments and can be variously modified without departing from the technical scope thereof.

In the above embodiments, Si is used as the semiconductor substrate material, but it is not limited to Si and it is possible to use silicon germanium (SiGe), germanium (Ge), silicon carbide (SiC), gallium arsenide (GaAs) or aluminum nitride (AlN) as the semiconductor substrate material. Further, the first and second semiconductor regions are not always required to have the opposite conductivity types, but they may have the same conductivity type with different impurity concentrations.

The plane orientation of the substrate material is not always limited to a (100) plane and a (110) plane, (111) plane or the like can be adequately selected. Further, this invention may contain a three-dimensional structure such as a Fin structure or double gate structure and can be applied to any type of MIS field effect transistor.

The essence of this invention lies in that the height of the Schottky barrier of the source/drain electrode is modulated according to impurity. Therefore, the overlap portion or offset portion between the gate electrode and the source/drain electrode, a position and angle of the electrode with respect to the channel direction and the like can be freely designed.

Figure 26:
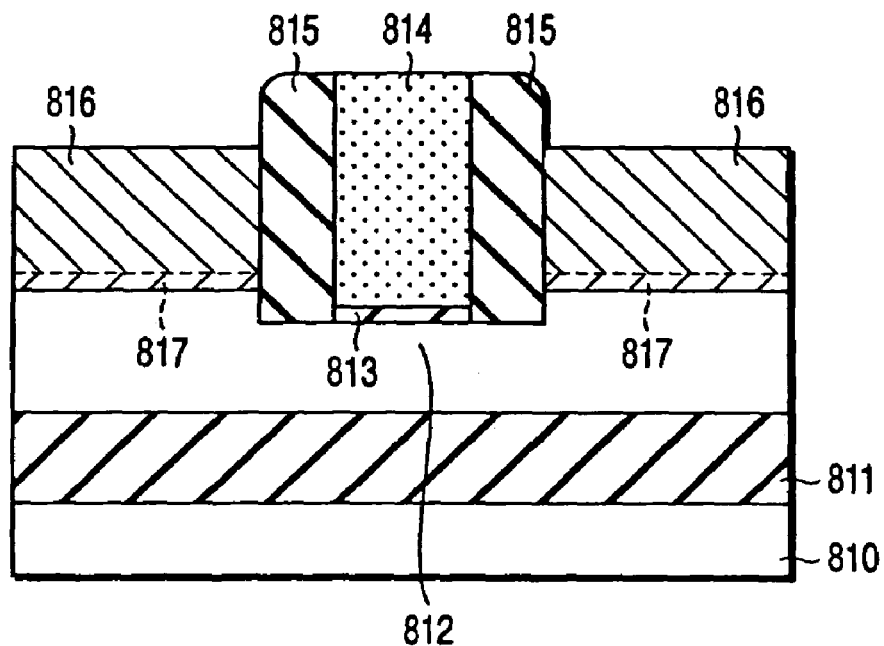
FIG. 26 is a cross sectional view showing the element structure of still another modification of this invention.
Figure 27:
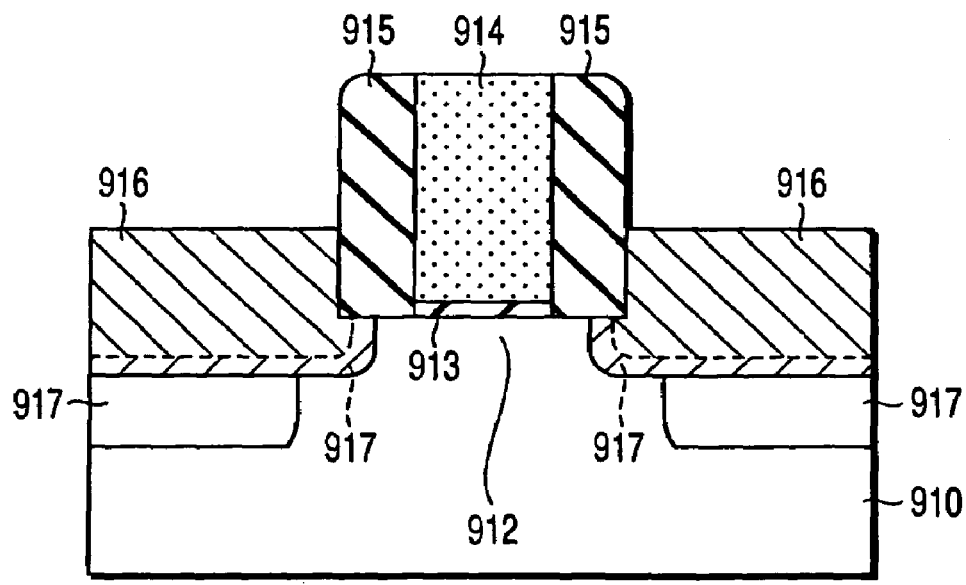
FIG. 27 is a cross sectional view showing the element structure of another modification of this invention.

In the embodiments, the source and drain electrodes are formed in contact with the buried oxide film, but this is not limitative. As shown in FIGS. 26 to 28, they can be formed separately from the buried oxide film. In this case, reference symbols 610 to 617 in FIG. 26, 710 to 717 in FIG. 27 and 810 to 817 in FIG. 28 respectively correspond to the reference symbols 210 to 217 in FIG. 14. With these structures, if the gate electric field is sufficiently strong, the contact resistance can be lowered in comparison with that of the structure shown in FIG. 14. Further, it is not necessary to form a rising source/drain shape, and in this case, the raising step can be omitted.

In the above embodiments, the SOI substrate is used, but elements can be formed on a bulk substrate without causing any problem. In this case, if there occurs a problem that a leak current flows from the bottom surface of the electrode, an impurity layer 917 having the same type as the carrier may be formed as shown in FIG. 29. Reference symbols 910 to 917 in FIG. 29 respectively correspond to the reference symbols 210 to 217 in FIG. 14. Further, the effect of this invention can be enhanced by forming the substrate by use of a material such as strained Si which can be expected to cause Schottky barrier modulation.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A field effect transistor comprising:
   a semiconductor region forming a channel region having an impurity concentration;
   a gate electrode insulatively disposed above the channel region; and
   a source metal electrode and a drain metal electrode which are formed on both sides of the channel region so as to contact and sandwich the channel region;
   wherein the source metal electrode and the drain metal electrode each have an impurity concentration higher than the impurity concentration of the channel region, and a peak of the impurity concentration at or near an interface with respect to the channel region, and
   wherein impurity contained in each of the source metal electrode and the drain metal electrode modulates height of a Schottky barrier in the interface between the semiconductor region and each of the source metal electrode and the drain metal electrode.

2. The field effect transistor according to claim 1, wherein the source metal electrode and the drain metal electrode are formed to sandwich the semiconductor region in a channel-length direction.

3. The field effect transistor according to claim 1, wherein the semiconductor region is made of Si, Ge, C, or a compound thereof, and the source metal electrode and the drain metal electrode are made of metal or compound of the metal and the semiconductor.

4. The field effect transistor according to claim 1, wherein the impurity which modulates the height of the Schottky barrier is at least one selected from the group consisting of B (boron), P (phosphorus), As (arsenic), O (oxygen), N (nitrogen), In (indium), Ga (gallium), and Sb (antimony).

5. The field effect transistor according to claim 4, wherein the channel region is formed of an n-type region, the source metal electrode and the drain metal electrode are made of at least one silicide selected from the group consisting of Er silicide, Y silicide, Gd silicide, Tb silicide, Dy silicide, Ho silicide, Tm silicide, Yb silicide, and Lu silicide.

6. The field effect transistor according to claim 4, wherein the source metal electrode and the drain metal electrode are made of at least one silicide selected from the group consisting of Pt silicide, Ni silicide, Pd silicide, Os silicide, Ir silicide, and Re silicide.

7. A field effect transistor comprising:
   a semiconductor region forming a channel region having an impurity concentration;
   a gate electrode insulatively disposed above the channel region; and
   a source metal electrode and a drain metal electrode which are formed on both sides of the channel region so as to contact and sandwich the channel region;
   wherein the source metal electrode and the drain metal electrode each have an impurity concentration higher than the impurity concentration of the channel region, and a peak of the impurity concentration at or near an interface with respect to the channel region, and
   wherein the semiconductor region, the source metal electrode, and the drain metal electrode are formed on an insulating film.

8. The field effect transistor according to claim 7, wherein the source metal electrode and the drain metal electrode are formed to sandwich the semiconductor region in a channel-length direction.

9. The field effect transistor according to claim 7, wherein impurities contained in each of the source metal electrode and the drain metal electrode modulate a height of a Schottky barrier in the interface between the semiconductor region and each of the source metal electrode and the drain metal electrode.

10. The field effect transistor according to claim 7, wherein the semiconductor region is made of Si, Ge, C, or a compound thereof, and the source metal electrode and the drain metal electrode are made of metal or compound of the metal and the semiconductor.

11. The field effect transistor according to claim 9, wherein the impurity which modulates the height of the Schottky barrier is at least one selected from the group consisting of B (boron), P (phosphorus), As (arsenic), O (oxygen), N (nitrogen), In (indium), Ga (gallium), and Sb (antimony).

12. The field effect transistor according to claim 11, wherein the channel region is formed of an n-type region, and the source metal electrode and the drain metal electrode are made of at least one silicide selected from the group consisting of Er silicide, Y silicide, Gd silicide, Tb silicide, Dy silicide, Ho silicide, Tm silicide, Yb silicide, and Lu silicide.

13. The field effect transistor according to claim 11, wherein the source and drain metal electrode are made of at least one silicide selected from the group consisting of Pt silicide, Ni silicide, Pd silicide, Os silicide, Ir silicide, and Re silicide.

* * * * *